(12) United States Patent
Smith et al.

(10) Patent No.: US 7,101,502 B2
(45) Date of Patent: *Sep. 5, 2006

(54) METHODS FOR FORMING OPENINGS IN A SUBSTRATE AND APPARATUSES WITH THESE OPENINGS AND METHODS FOR CREATING ASSEMBLIES WITH OPENINGS

(75) Inventors: John Stephen Smith, Berkeley, CA (US); Mark A. Hadley, Newark, CA (US); Gordon S. W. Craig, Palo Alto, CA (US); Frank Lowe, Berkeley, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/154,899

(22) Filed: May 23, 2002

(65) Prior Publication Data

US 2004/0004058 A1   Jan. 8, 2004

Related U.S. Application Data

(63) Continuation of application No. 09/432,512, filed on Nov. 2, 1999, now Pat. No. 6,479,395.

(51) Int. Cl.
*B28B 11/00* (2006.01)

(52) U.S. Cl. .................... 264/232; 264/340; 216/2; 216/18; 216/39

(58) Field of Classification Search ............ 438/706, 438/708, 710, 714, 717, 723, 745, 756; 216/2, 216/24, 39, 41, 52
See application file for complete search history.

(56) References Cited

U.S. PATENT DOCUMENTS 4,472,240 A   9/1984   Kameyama (Continued)

FOREIGN PATENT DOCUMENTS

EP   0607808 A2   7/1994

OTHER PUBLICATIONS

Talghader, J.J. et al "Integration of Fluidically Self-Assembled Optoelectronic Devices Using a Silicon-Based Process" IEEE Photonics Technology Letters, 7 (11) 1321-1323, Nov. 1995.*

(Continued)

*Primary Examiner*—Anita Alanko
(74) *Attorney, Agent, or Firm*—Blakely, Sokoloff, Taylor & Zafman LLP

(57) ABSTRACT

Methods for forming openings having predetermined shapes in a substrate and apparatuses with these openings. The methods may be used to form assemblies which include the substrate with its openings and elements which are disposed in the openings. In one example of a method, each of the elements include an electrical component and are assembled into one of the openings by a fluidic self assembly process. In an particular example of a method to create such an opening, the substrate is etched through a first patterned mask and is later etched through a second patterned mask. Typically, the second patterned mask is aligned relative to the opening created by etching through the first patterned mask and has an area of exposure which is smaller than an area of exposure through the first patterned mask. In another example of a method, a photosensitive material is exposed through a patterned mask to oblique sources of light such that some of the light impinges into a first portion of the photosensitive material which is under the patterned mask, and the patterned mask and a second portion of the photosensitive material, which is under the patterned mask, is removed. In another example of a method, an opening in a first layer, which comprises silicon dioxide, is formed by depositing a second layer over the first layer and depositing a tungsten layer over the second layer. The tungsten and second layers are patterned to expose a portion of the first layer, and this portion is etched. Various apparatuses which may be made using these methods are also described.

28 Claims, 18 Drawing Sheets

U.S. PATENT DOCUMENTS

| | | | |
|---|---|---|---|
| 4,484,978 A | 11/1984 | Keyser | 156/643 |
| 4,496,418 A | 1/1985 | Ham | |
| 5,228,926 A * | 7/1993 | Glatfelter et al. | 136/259 |
| 5,316,618 A | 5/1994 | van Lintel | |
| 5,389,198 A | 2/1995 | Koide et al. | |
| 5,470,693 A | 11/1995 | Sachdev et al. | |
| 5,545,291 A * | 8/1996 | Smith et al. | 438/107 |
| 5,629,237 A | 5/1997 | Wang et al. | 438/701 |
| 5,698,902 A | 12/1997 | Uehara et al. | 257/773 |
| 5,714,038 A | 2/1998 | Kim | |
| 5,904,545 A | 5/1999 | Smith et al. | |
| 6,001,537 A | 12/1999 | Ohsumi et al. | 430/313 |
| 6,054,340 A | 4/2000 | Mitchell et al. | 438/132 |
| 6,281,038 B1 * | 8/2001 | Jacobsen et al. | 438/106 |
| 6,507,989 B1 * | 1/2003 | Bowden et al. | 29/592.1 |
| 6,527,964 B1 * | 3/2003 | Smith et al. | 216/19 |
| 6,623,579 B1 * | 9/2003 | Smith et al. | 156/73.6 |

OTHER PUBLICATIONS

Berlin, E V et al, "Photo-template pattern" SU 1314881 A1, Derwent abstract, Nov. 15, 1993.*

Hsi-Jen J. Yeh and John S. Smith, "Fluidic Self-Assembly of Microstructures and its Application to the Integration of GaAs on Si," Proceedings of the Workshop on Micro Electro Mechanical Systems (MEMS), IEEE 1994, New York (document No. XP000528430), 6 pgs.

PCT Invitation to Pay Additional Fees for Int'l Appln No. PCT/US00/41003, mailed Apr. 16, 2001, 6 pgs.

* cited by examiner 10.0 u

METHODS FOR FORMING OPENINGS IN A SUBSTRATE AND APPARATUSES WITH THESE OPENINGS AND METHODS FOR CREATING ASSEMBLIES WITH OPENINGS

RELATED APPLICATIONS

This is a continuation of application Ser. No. 09/432,512, filed on Nov. 2, 1999 now U.S. Pat. No. 6,479,395.

FIELD OF THE INVENTION

The present invention relates generally to the field of fabricating openings in a substrate and also to apparatuses with these openings. More particularly, the present invention relates to methods for forming openings in a substrate which openings are designed to receive an element which is later placed into the opening and which element includes at least one functional component, and the present invention relates to methods for creating assemblies with the openings.

BACKGROUND OF THE INVENTION

There are many examples of large arrays of functional components which can provide, produce or detect electromagnetic signals or chemicals or other characteristics. An example of such a large array is that of a display where many pixels or sub-pixels are formed on an array of electronic elements. For example, an active matrix liquid crystal display includes an array of many pixels or sub-pixels which are fabricated on amorphous silicon or polysilicon substrates which are large. As is well known in the art, it is difficult to produce a completely flawless active matrix liquid crystal display (LCD), when the display area is large, such as the LCD's on modern laptop computers. As the display area gets larger and larger, the yield of good displays decreases. This is due to the manner in which these display devices are fabricated.

Silicon VLSI can be used to produce such an array over a silicon wafer's surface, but silicon wafers are limited in size, limited in conductivity, and not transparent. Further, processing of large areas on silicon wafers can be expensive. Displays which valve the light coming through them need to be transparent. Single crystal silicon can be bonded to a glass substrate and then etched to remove most of the area to achieve transparency, but this is intrinsically wasteful in that, for the sake of maximizing light transmission, the majority of the processed material is discarded and becomes chemical waste. The under-utilization of the precious die area wastes resources, causes greater amounts of chemical waste to be generated in the process, and is generally inefficient and expensive. Another example is photodiode arrays which may be used to collect solar energy. Large arrays of silicon photodiodes with concentrating lenses have been made by sawing wafers and using a pick and place assembly, but thermal dissipation is poor for large elements, and the small elements require too much assembly time.

Alternative approaches to fabricating arrays such as displays include fabricating the desired circuitry in an amorphous or polycrystalline semiconductor layer which has been deposited on a substrate, such as glass or quartz. These approaches avoid the limitations of the size of the available single crystal silicon wafers, and avoid the cost of the single crystal wafers, but require expensive deposition of the semiconductor layer, and they still require processing of the entire large substrate to form the active elements in an array, still resulting in the production of much chemical waste and wasted resources. These processes also limit the choice of the substrate; for example, plastic substrates cannot be used due to the nature of the processes which deposit the semiconductor layers. Furthermore, amorphous or polycrystalline silicon semiconductor elements do not perform as well as those made from single crystal semiconductor material. For displays, as an example, it is often difficult or impossible to form some of the desired circuitry out of the amorphous or polycrystalline semiconductor materials. Thus, high frequency edge drivers may be impossible to form out of these materials. This results in the difficulty and expense of attaching an electrical lead for each and every row and column of an array, such as an active matrix liquid crystal display array.

As noted above, another difficulty with the existing techniques is that the large number of elements in a large array results in a low probability that all of them will work properly and thus the yield of acceptably good arrays from the manufacturing process is low. Furthermore, there is no possibility of testing any of the elements until the assembly is complete, and then any imperfection in the array must be tolerated or the entire array could be discarded or special and expensive techniques must be used to repair it. These problems result from the fact that the various elements in the array are fabricated on the array rather than separately.

It is possible to separately produce elements, such as pixel drivers and then place them where desired on a different and perhaps larger substrate. Prior techniques can be generally divided into two types: deterministic methods or random methods. Deterministic methods, such as pick and place, use a human or robot arm to pick each element and place it into its corresponding location in a different substrate. Pick and place methods place devices generally one at a time, and are generally not applicable to very small or numerous elements such as those needed for large arrays, such as an active matrix liquid crystal display. Random placement techniques are more effective and result in high yields if the elements to be placed have the right shape. U.S. Pat. No. 5,545,291 describes a method which uses random placement. In this method, microstructures are assembled onto a different substrate through fluid transport. This is sometimes referred to as fluidic self assembly (FSA). Using this technique, various blocks, each containing a functional component, may be fabricated on one substrate and then separated from that substrate and assembled onto a separate substrate through the fluidic self assembly process. The process involves combining the blocks with a fluid and dispensing the fluid and blocks over the surface of a receiving substrate which has receptor regions (e.g. openings). The blocks flow in the fluid over the surface and randomly align onto receptor regions.

Thus the process which uses fluidic self assembly typically requires forming openings in a substrate in order to receive the elements or blocks. Methods are known in the prior art for forming such openings and are described in U.S. Pat. No. 5,545,291. One issue in forming an opening is to create its sidewalls so that blocks will self-align into the opening and drop into the opening. The substrate having openings in the glass layer 10 may be used as a receiving substrate to receive a plurality of elements by using a fluidic self assembly method. FIG. 1A shows an example where a separately fabricated element 16 has properly assembled into the opening 14. However, it has been discovered that at times, an element 16 will not properly assemble into an opening 14 due to the fact that the element 16 becomes turned upside down and then lodges in the top of the opening 14. An example of this situation is shown in FIG. 1B. Often times, the inverted element 16 lodges into the opening 14 so tightly that it remains in the opening and prevents non-inverted elements from falling into the opening 14. Thus, the opening at the end of the assembly process will typically not be filled with an element or perhaps worse, may still contain an inverted element lodged at the top of the opening 14.

FIGS. 2A through 2D show an example in the prior art for creating a plurality of openings in a receiving substrate which is designed to receive a plurality of separately fabricated elements which are deposited into the openings through fluidic self assembly. The method shown in FIGS. 2A through 2D begins by, in one example, thermally growing a silicon dioxide layer on a silicon substrate 20. The resulting structure is shown in FIG. 2A with the silicon dioxide layer disposed over the silicon substrate 20. Then, a photoresist material may be applied, and exposed through a lithographic mask and then developed to produce a patterned mask formed from the developed photoresist. Then an etching solution is applied to etch through the patterned mask to create an opening 24 in the silicon dioxide layer 22. The resulting structure is shown in FIG. 2B. Then, the silicon dioxide layer 22 with its opening 24 is then used as a patterned mask to etch the silicon layer 22 to create the opening 26 in the silicon layer 20 as shown in FIG. 2C. This etching of the silicon layer 20 may be performed with a KOH etchant or with an EDP etchant as described in U.S. Pat. No. 5,545,291. After etching the opening 26 in the silicon layer 20, the silicon dioxide layer 22 is removed, for example, by an etch in a hydrofluoric acid solution. This results in the structure shown in FIG. 2D where the opening 26 is now ready to receive a separately fabricated element through an assembly process, such as for example, fluidic self assembly or perhaps a pick and place procedure. The structure shown in FIG. 2D has the drawback that a monocrystalline silicon layer is required in order to use the KOH etch to form the hole.

Often, it will be desirable to obtain a deep enough opening without making the opening too wide. This, of course, will depend on the shape, which is typically predetermined, of the separately fabricated element or block which is to be deposited into the opening. Naturally, the shape of the opening is designed to fit substantially the shape of the separately fabricated element. Often times, it is necessary to obtain an angle in the opening which is steeper than a 45° angle. These various requirements and the problems associated with inverted elements which become lodged in openings have resulted in attempts to improve the methods for fabricating the openings in a receiving substrate.

From the above, it is seen that it is desirable to provide methods for forming openings in a receiving substrate and to provide methods for creating assemblies with these openings.

SUMMARY OF THE INVENTION

The present invention provides various methods for creating an opening in a substrate and also provides apparatuses resulting from these methods. In one example of a method according to the present invention, an opening which has a predetermined cross-sectional shape is created in a substrate. The opening is designed to receive an element which is separately fabricated and which typically includes at least one functional component and which is placed into the opening in a process such as pick and place or fluidic self assembly. In this example, the method involves etching the substrate through a first patterned mask for a first portion of an etch time and etching the substrate through a second patterned mask for a second portion of the etch time. In one particular example of this method, the first and second patterned masks are different.

In another example of a method according to the present invention, an opening which has a predetermined cross-sectional shape in a substrate and which is designed to receive an element which is placed into the opening is created by applying a patterned mask over a material which is sensitive to electromagnetic radiation and exposing the material and the patterned mask to electromagnetic radiation which is project obliquely to a surface of the material such that some of the electromagnetic radiation impinges into a first portion of the material which is under the patterned mask. The patterned mask is removed and a second portion of the material which was under the patterned mask is also removed.

According to another aspect of the present invention, a method is provided for forming an opening in a first layer which includes silicon dioxide. In this method, a second layer is deposited over the first layer which includes silicon dioxide, and a metal adhesion layer, such as a tungsten layer is deposited over the second layer. The metal adhesion layer is patterned and the second is patterned to expose a portion of the first layer which is then etched.

The present invention also provides a substrate having at least one opening which is designed to receive an element having a predetermined shape. The element is fabricated separately and assembled into the opening. The opening includes in a region near its top edge a beveled surface which in one exemplary embodiment is designed to decrease the frequency of inverted elements from being wedged into the top of the opening.

According to another aspect of the invention, a method for creating an opening in a layer is described. The opening is for receiving an element which is placed into the opening. The method includes forming a first layer on a substrate, depositing a second layer over the first layer, and ablating selectively the second layer at at least one desired region to create an opening in the second layer at the at least one desired region, wherein the ablating stops automatically at the first layer.

According to another aspect of the invention, another method for creating an opening in a substrate is described. The opening is for receiving an element which is fabricated on another substrate and is placed in the opening. The method includes forming an organic layer on a glass substrate and forming an opening in the organic layer.

According to another aspect of the invention, a method for etching glass in an etching solution is described. The etching solution has certain described concentrations of hydrofluoric acid, a counter acid (e.g. HCl, HBr, HI, $HNO_3$, or $H_2SO_4$) and water and the etching of the glass with the etching solution is performed at a reduced temperature in the range of about 0° C. to about 10° C.

These aspects as well as other features of the present invention will be described further below.

BRIEF DESCRIPTION OF THE DRAWINGS

The present invention is illustrated by way of example and not limitation in the figures of the accompanying drawings in which like references indicate similar elements.

FIGS. 8A, 8B, 8D, 8E, and 8F are cross sectional views, and FIG. 8C is a top plan view.

DETAILED DESCRIPTION

The present invention relates to methods and apparatuses for forming openings in a receiving substrate. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

The present invention relates generally to the field of creating openings in a receiving substrate and to apparatuses having these openings. The present invention may be used to fabricate openings for various different types of arrays. Typically, each element in the array includes a functional component which may be an electrical component, a chemical component, or an electromechanical structural element or a micro electromechanical structural element or a micromechanical structural element. The various methods of the present invention are illustrated in certain detailed examples with regard to the manufacture of an active matrix liquid crystal display, but it will be recognized that the invention will have wider applicability. Merely by way of example, the invention may be applied to the fabrication of an electronic array which can be used to deliver precise voltages for the control of liquid crystal cells to create a liquid crystal display or may be used for other types of displays such as electroluminescent displays or light emitting diode displays or displays using electrophoretic ink display pixels, such as microencapsulated electrophoretic ink display pixels, and also for other applications requiring sampling or producing electrical signals over a large array of electrodes, such as memories and imaging arrays and photo diode arrays. Further, the present invention may be used with electromagnetic signal detectors (e.g. antennas), or solar cells, or chemical sensors.

In a preferred embodiment of the present invention, an opening has a predetermined size which is designed to receive an element also of the same predetermined size so that the element fits into the opening. By controlling the fit between the element and the opening, it is possible to have the elements self assemble into the openings. Accordingly, in a preferred embodiment of the present invention, each element has a trapezoidal cross-sectional shape which fits into a trapezoidal opening in which the top of the opening has a larger area than the bottom of the opening. Furthermore, it is desirable to form a deep opening without making the opening too wide. FIGS. 3A through 3G illustrate cross-sectional views after various processing operations according to one example of the present invention.

Figure 3A:
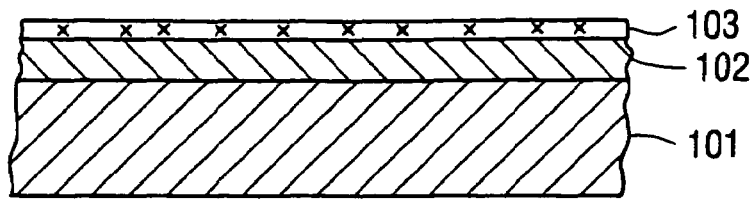
FIGS. 3A through 3G show cross-sectional views of one method according to the present invention of forming an opening in a receiving substrate.
Figure 3B:
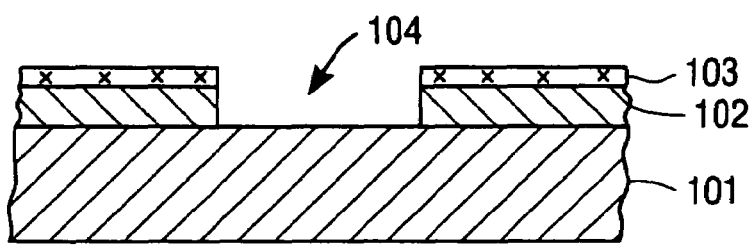

The method shown by FIGS. 3A through 3G begins with the substrate 101 which is typically glass in the case of an active matrix liquid crystal display (of the transmissive type). It will be appreciated that this substrate may be a different material for other types of arrays. The glass substrate 101 is covered by an amorphous silicon layer 102 which may be deposited by PECVD to a total thickness of approximately 500 Angstroms to three thousand Angstroms. An optional tungsten layer 103 (or other metal adhesion layers such as, for example, titanium, tungsten, or chrome) may be deposited by sputtering; this optional tungsten layer 103 is deposited on top of the amorphous silicon layer 102 as shown in FIG. 3A. Then lithography is used to provide a patterned mask layer with openings of the shape desired for the resulting hole in the substrate 101. In one case, the size of the openings in the substrate are approximately 0.5 microns to 5 microns larger than the blocks to be assembled into the openings. Typically, a photoresist is used to create the patterned mask. This patterned mask may be created on top of the optional tungsten layer 103 by spinning photoresist onto the entire structure, exposing the photoresist through a lithographic mask and then developing the photoresist layer to create the pattern mask. Then the tungsten layer 103 is etched and the amorphous silicon layer 102 is etched to creating an opening 104 as shown in FIG. 3B. The optional tungsten layer is used to increase adhesion to photoresist to prevent pinholes in the underlying structure and results in an improved receiving substrate. This opening 104 exposes the top surface of the substrate 102 so that it may be etched to create the opening 105 shown in FIG. 3C.

In one example of the present invention, the etch to create the opening 105 is a wet etch. The preferred etch mix depends on the type of glass used. The etch mix contains dilute hydrofluoric acid and, preferably, an additional acid such as nitric acid, sulfuric acid, perchloric acid, or more preferably a halide acid such as hydrobromic acid or hydrochloric acid or hydriodic acid. The ratio of water to the second acid to hydrofluoric acid ranges from 2:1:1 to 50:20:1, depending on the type of glass used for the substrate. The substrate is etched for roughly one quarter of the total etch time. In one particular embodiment, the ratios of an etchant which includes water, hydrochloric acid and hydrofluoric acid is 4:1:1 (water:hydrochloric:hydrofluoric) and the total etch time is such that the total depth of the etchant produces an opening having a depth of 14.5 microns.

The glass can be etched with any hydrofluoric acid-based etch solution, with hydrofluoric acid concentration ranging from concentrated hydrofluoric acid to 1% concentrated hydrofluoric acid in water. In a preferred embodiment, the glass is soda lime glass, and is etched with a mixture of hydrofluoric acid:counter acid:water in which the water content ranges from 50% to 95%, the hydrofluoric acid content ranges from 25% to 1%, and the counter acid content ranges from 40% to 5%. The counter acid could be nitric acid or sulfuric acid, or more preferably, hydriodic acid, or hydrobromic acid, or most preferably, hydrochloric acid. The temperature of the etching solution is maintained at a temperature in the range of from −10° C. to 40° C. In a more preferred embodiment, the glass is borosilicate or aluminosilicate glass, such as Corning 7059 or Corning 1737, respectively, and is etched in an etch mix as above, in which the water content ranges from 60% to 95%, the hydrofluoric acid content ranges from 10% to 1%, and the counter acid, as described above, ranges from 30% to 5%. In the most preferred embodiment, the temperature of the borosilicate or aluminosilicate glass etch described above is controlled to within 0.5 degrees C., at a specified temperature between −5 and 5 degrees C. In the most preferred embodiment, the etch solution is 1 part HF to 10 parts HCl to 100 parts H$_2$O.

Figure 3C:
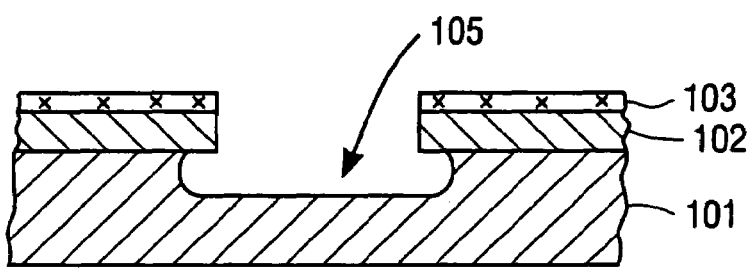
Figure 3D:
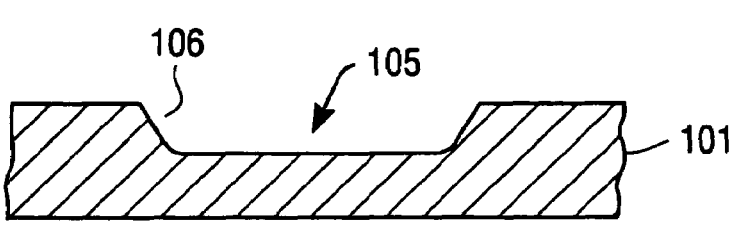
Figure 3E:
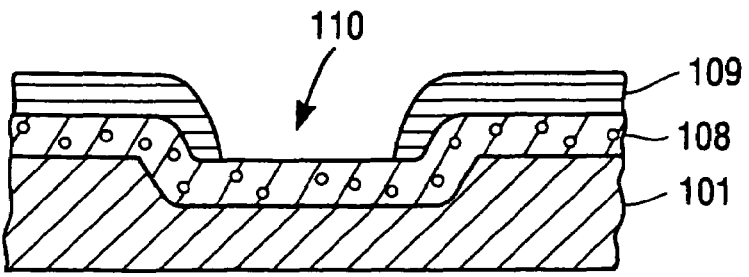
Figure 3F:
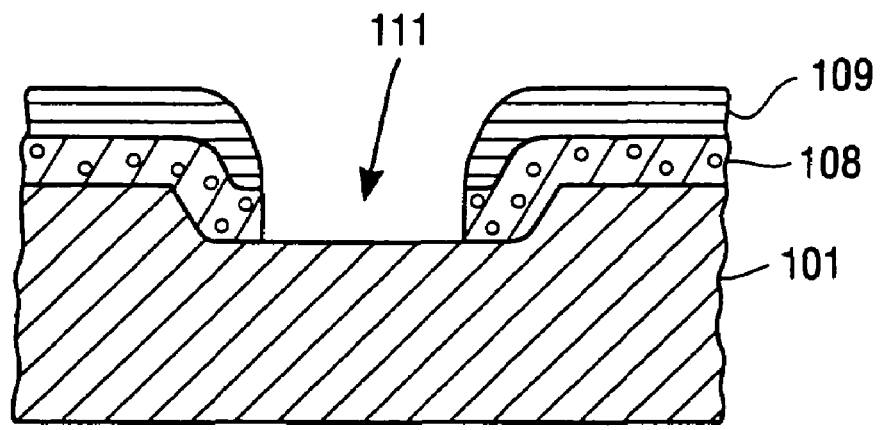
Figure 3G:
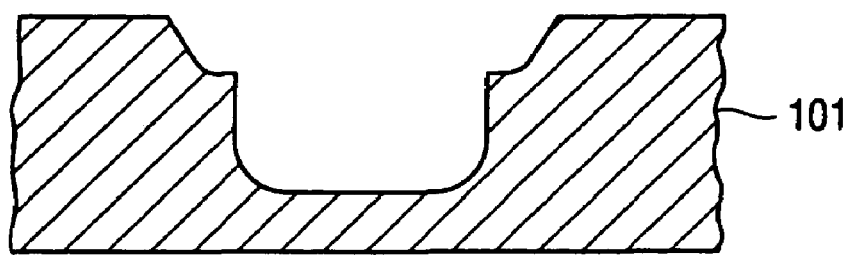

After the opening 105 has been formed in the substrate 101 as shown in FIG. 3C, the tungsten layer 103 and the amorphous silicon layer 102 are removed over the entire substrate, and then the entire substrate is blanket etched for an additional one quarter of the entire etch time. This produces the structure shown in the cross-sectional view of FIG. 3D in which the opening 105 is deepened and at the same time the top edge of the opening is widened to provide the beveled edge 106 which is created by the removal of material from the top of the substrate and sides of the hole, thereby changing the shape of the sides of the hole. Typically, this blanket etch is the same etch mix used to create the initial opening 105 shown in FIG. 3C. The beveled edge 106 at the top of the opening 105 tends to prevent an inverted element from lodging at the top of the opening 105 during the assembly of the element into the opening. As can be seen from FIG. 3G, the beveled edge 106 creates an opening which has at least two slopes along the surface of the opening, where one of these slopes is an average of the slopes along the edge 106 and the other slope is substantially vertical as shown in FIG. 3G.

After the beveled edge is created at the top of the opening, another amorphous silicon layer 108 is deposited onto the entire top of the substrate. The amorphous silicon may be deposited by a PECVD or CVD or a sputtering process to a total thickness of about a thousand Angstroms. An optional tungsten layer (which is preferably about 100 to 1000 Angstroms thick) may then be deposited (e.g. by sputtering) on the layer 108. Then a photoresist layer 109 is applied to the top of the amorphous silicon layer 108 (or on top of the optional tungsten layer if the tungsten layer is applied), and this photoresist layer 109 is patterned to create the opening 110 in the photoresist layer 109 (and in the optional tungsten layer if present) as shown in FIG. 3E. The patterned photoresist layer 109 forms an opening 110 which is smaller than the original opening 104 in the patterned mask used to create the structure shown in FIG. 3B. The exposed surface of the amorphous silicon layer 108, which is exposed at the opening 110 as shown in FIG. 3E, is then etched to create an opening 111 as shown in FIG. 3F. This opening 111 exposes a top surface of the substrate 101 which is at the bottom of the opening 105 as it now exists in this sequence of processing operations. The substrate 101 is now etched through the opening 111 with the same etch solution described above to create the opening shown in FIG. 3G. FIG. 3G shows the opening after the amorphous silicon layer 108 and the photoresist layer 109 have been removed. Typically, the patterned photoresist layer 109 is first stripped (and if present the optional tungsten layer is stripped) and then the amorphous silicon 108 is removed creating the structure shown in FIG. 3G.

Figure 3H:
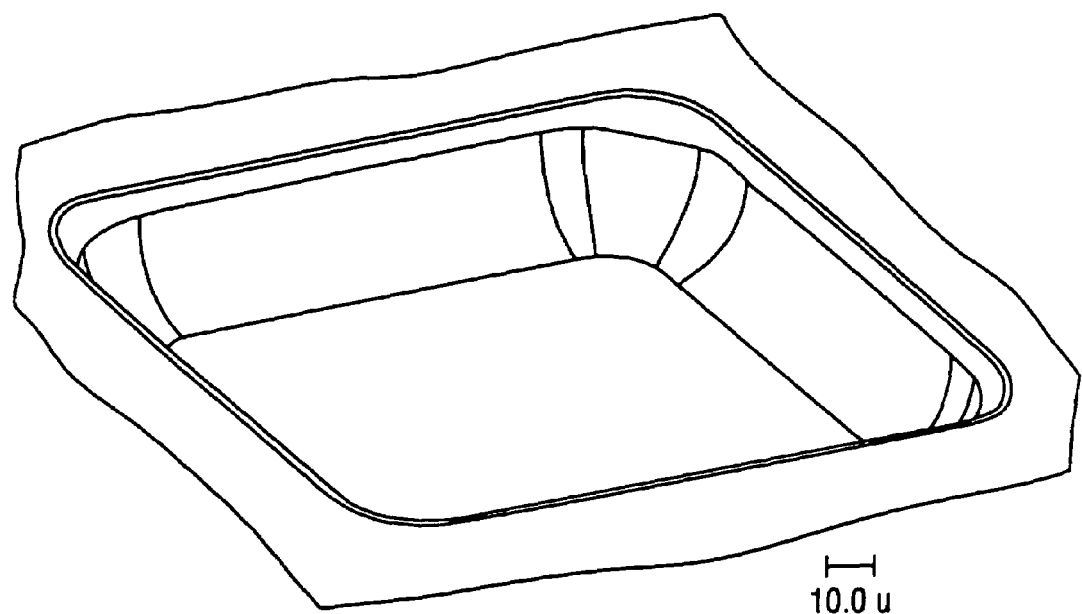
FIG. 3H is a perspective electron micrograph image of an opening formed according to this method.
Figure 3I:
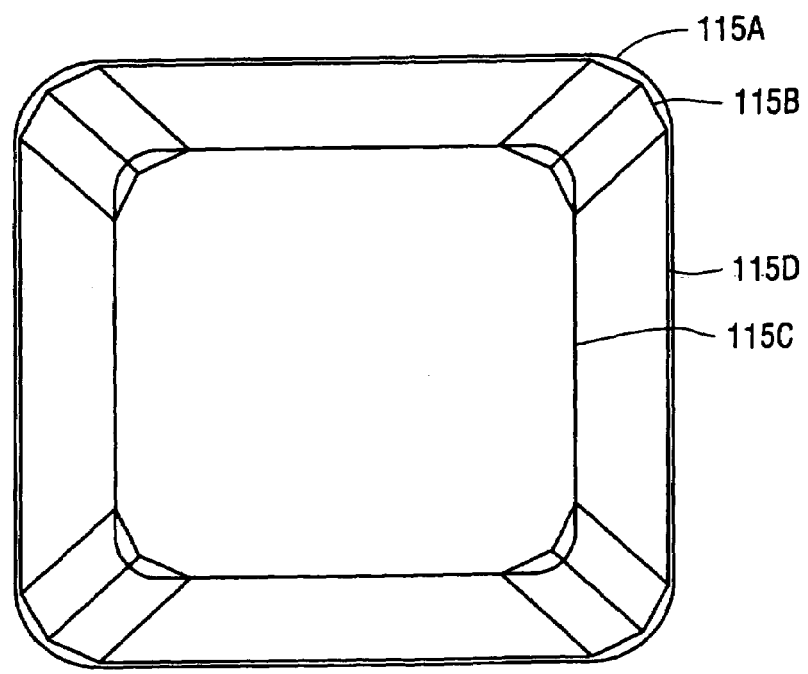
FIG. 3I shows an example of a block in a hole.

FIG. 3H shows an electron micrograph image of an opening which may be formed with the method shown in FIGS. 3A–3G. FIG. 9E is a cross-sectional view of a similar opening. As can be seen from FIG. 3H and FIG. 9E, the opening has a bevel at its top edge. The rest of the opening is deep without having an upper cross-sectional area which is too large. If this upper cross-sectional area of the opening is too large, then inverted blocks will tend to get stuck in the opening. FIG. 3I is a stick drawing of a block in an opening. The edge 115A of the opening nearly abuts the edges 115B and 115D of the top of the block. The bottom edge 115C of the block is shown through the body of the block which has been made, for purposes of illustration, to be transparent. An example of dimensions for a particular block and matching opening will now be provided.

Figure 9A:
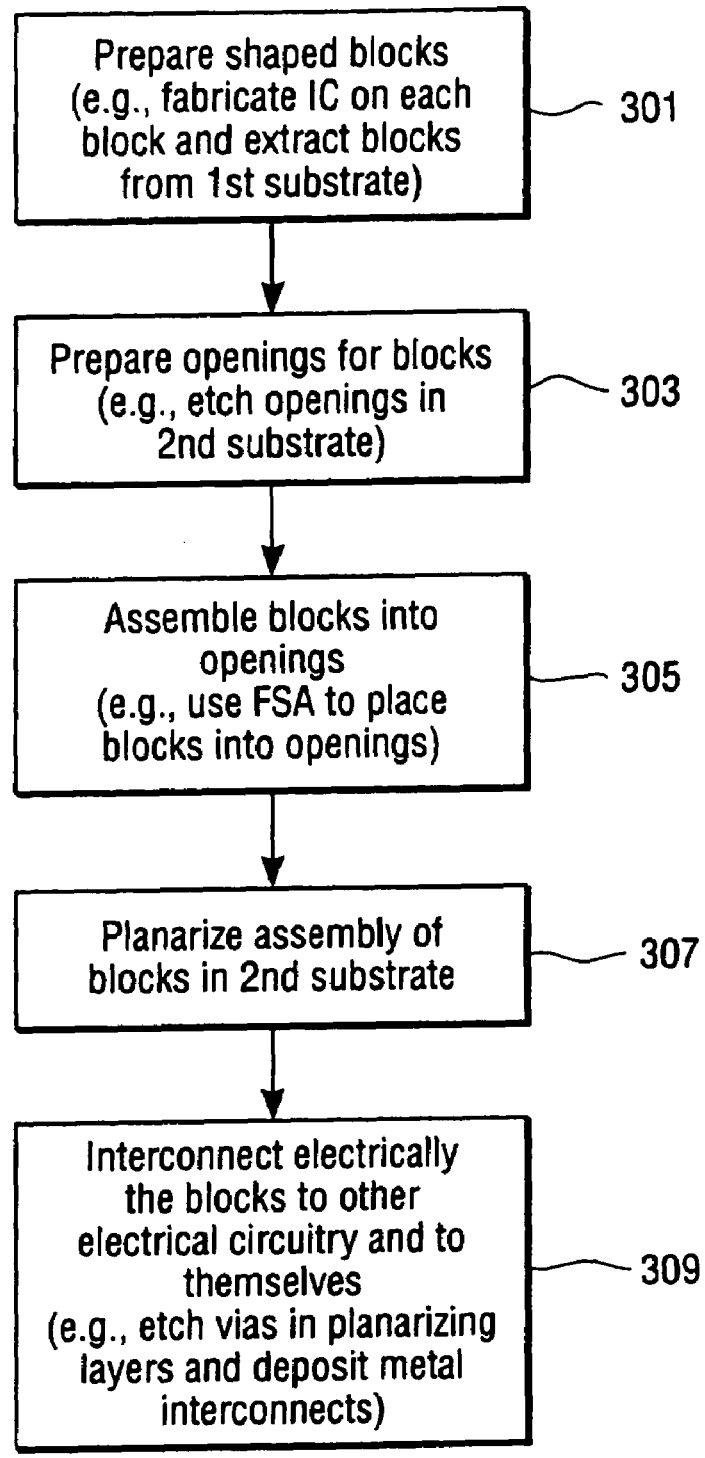
FIG. 9A is a flowchart which illustrates a general process for forming an assembly by placing elements into the openings in the receiving substrate.
Figure 9B:
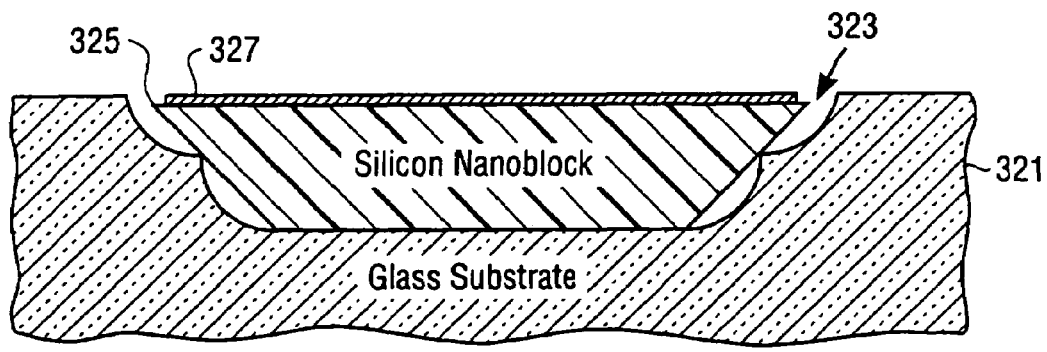
FIGS. 9B, 9C and 9D show a cross-sectional view of one example of an assembly according to the present invention in which silicon blocks which include electrical functional components are assembled into the openings in a receiving substrate which in this case is a glass substrate.
Figure 9C:
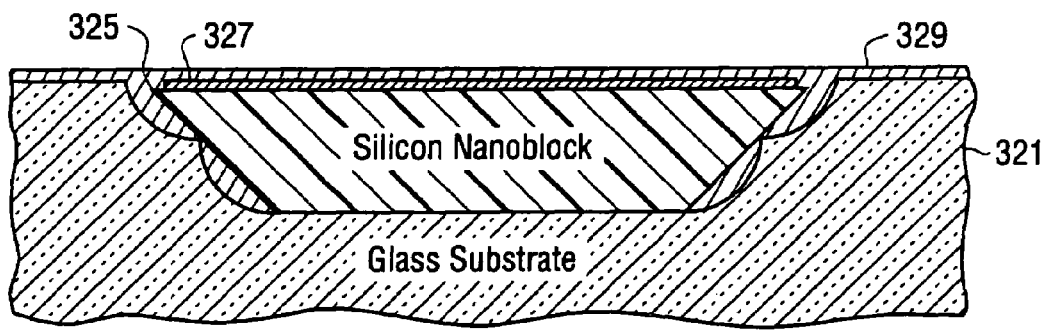
Figure 9D:
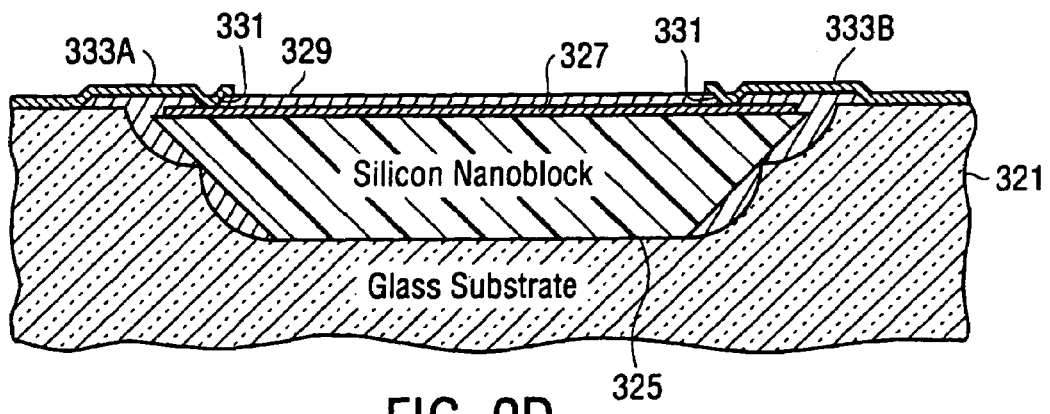
Figure 9E:
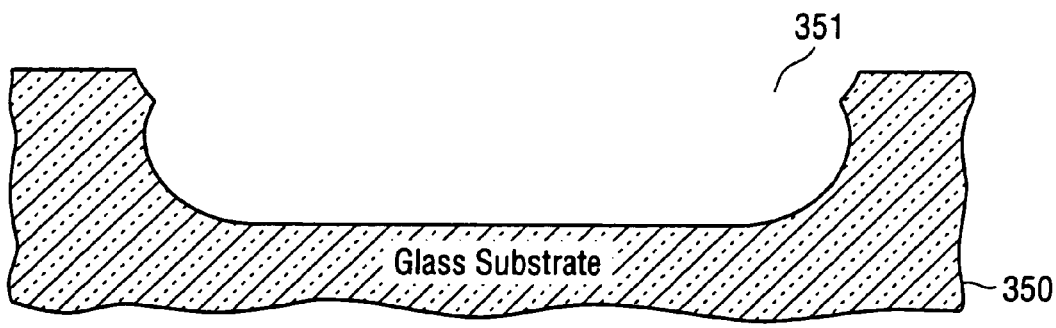
FIGS. 9E, 9F, 9G, and 9H show cross-sectional views of another example of an assembly according to the present invention in which silicon blocks, which include functional components, are assembled into the openings in a receiving substrate. The openings shown in FIGS. 9E, 9F, 9G and 9H may be formed with the method illustrated in FIGS. 3A–3G.
Figure 9F:
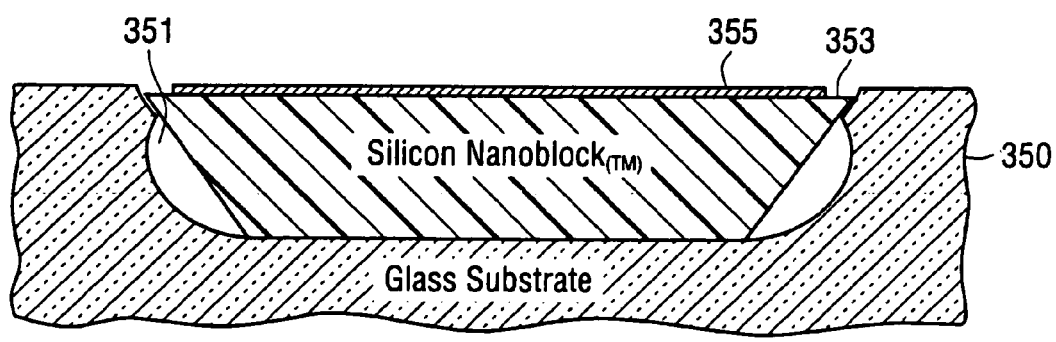
Figure 9F:
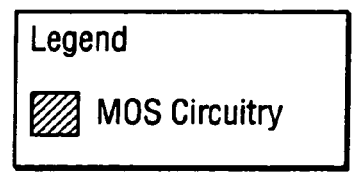

By means of an example, given a block 353 with the cross-section shape shown in FIG. 9F and dimensions: bottom width 131 microns, top width 182 microns and total thickness of 38 microns, circuit thickness 2 microns and angles of 54.7 degrees. The suitable hole would be etched with the following parameters. Opening 104 in layers 103 and 102 of FIG. 3B should be of width 145 microns. Then the glass should be etched (see previously mentioned etch conditions) a total of 14 microns. This forms opening 105 in the glass with a total width of 173 microns. Then the blanket etch (between 3C and 3D) should be for a depth of 7 microns. This increases the opening 105 to a width of 185 microns. The opening in the second mask material (108 of 3F) should be of a width 130 microns. The glass should then be etched a total of 24 microns making the depth of the hole 38 microns. The cross-section of the block 353 and hole 351 combination is shown in FIG. 9F.

The following parameters create a block and opening combination which produces good self-assembly.

| Block Parameters | Hole Parameters | | |
|---|---|---|---|
| thickness = 38.0–38.0 | depth = 38.0–38.0 | top1 = 184.6–184.6 | |
| bottom_width = 131.0–131.0 | etch1 = 14.0–14.0 | top2 = 173.0–173.0 | |
| top_width = 18 1.9–181.9 | etch2 = 7.0–7.0 | length1 = 145.0–145.0 | |
| delta_thickness = 2.0 | etch3 = 24.0–24.0 | length2 = 130.0–130.0 | |
| delta_corner = 10.0 | marker = 19.8 | radius1 = 4.0 | |
| | | radius2 = 12.0 | |

In one example of the method shown in FIGS. 3A through 3G, the total depth of the opening is 39 microns, and three etches are used to create the opening, where the total etch time is the total time for the three etches. The first and the third etch are through a first and second patterned mask respectively, and the second etch is without a patterned mask or at least uses a mask which allows the top edge of the openings to be exposed. Typically, the first etch is for a quarter of the total etch time, the second etch is for a quarter of the total etch time, and the third and last etch is for one half of the entire etch time. Using the method shown in FIGS. 3A through 3G, it is possible to create a deep opening which is not too wide and which includes a beveled edge. This opening has improved characteristics for receiving separately fabricated elements which may be assembled by a self assembly process, such as fluidic self assembly.

Figure 4A:
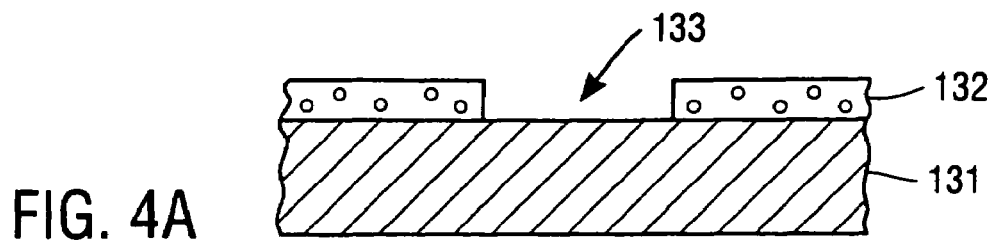
FIGS. 4A through 4F show in cross sectional views another method according to the present invention for forming openings in a receiving substrate.
Figure 4B:
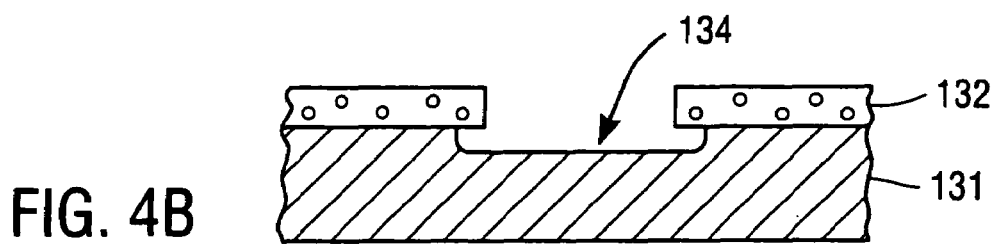
Figure 4C:
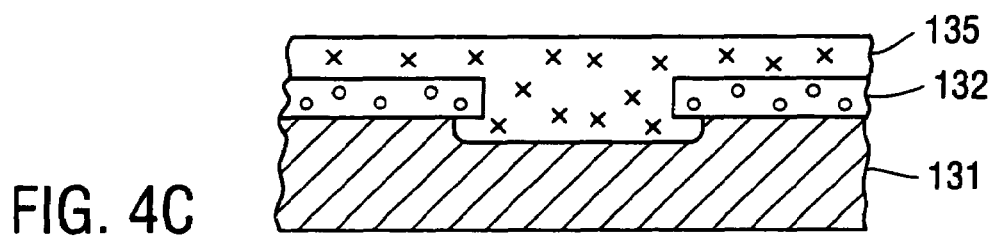
Figure 4D:
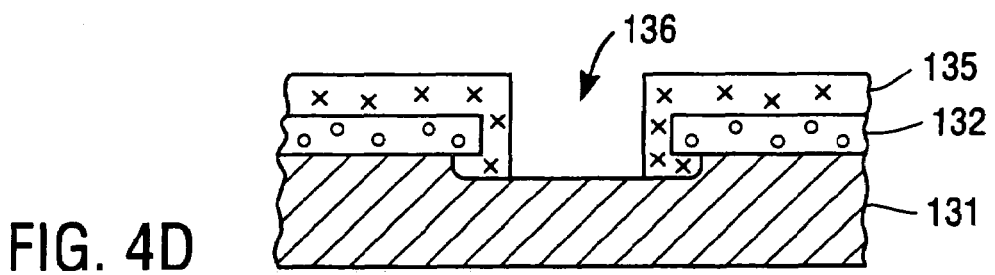
Figure 4E:
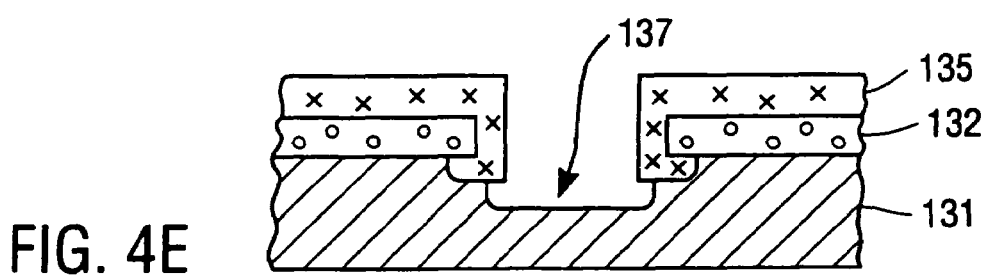
Figure 4F:
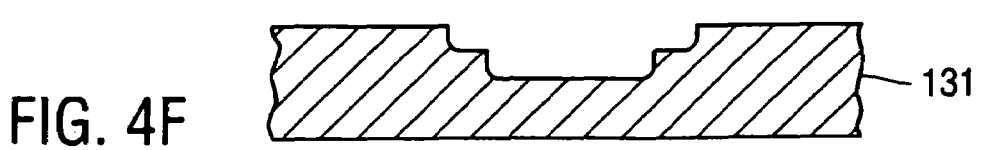

FIGS. 4A through 4F show cross-sectional views through an opening fabricated according to another method of the present invention. Each of these figures shows the state of the opening after certain other process operations in this method. FIG. 4A shows a patterned mask layer 132 which includes an opening 133 exposing a top surface of a substrate 131 which may be glass in one embodiment. The patterned mask layer 132 may be, for example, chrome. The exposed areas of the substrate 131 are etched using an appropriate etchant. In one example, this etch is a wet etch bath using hydrofluoric acid which creates the opening 134 in the substrate 131 as shown in FIG. 4B. This etch in one example is two-thirds of the total etch time used in the process shown in FIGS. 4A through 4F. A second blanket mask, such as a photoresist layer, is deposited over the entire substrate. FIG. 4C shows an example when the blanket mask layer 135 has been deposited over the entire substrate and has filled the opening 134. This second blanket mask layer is then patterned using, for example, photolithography, to pattern the photoresist layer 135 to create the opening 136 shown in FIG. 4D. This opening exposes the bottom surface of the opening 134 in the substrate 131. The size of the opening 136 is smaller than the size of the opening 134 as can be seen by comparing FIGS. 4B and 4D. The substrate shown in FIG. 4D is then etched again to etch the exposed surfaces of the substrate through the openings 136 to create the opening 137 shown in FIG. 4E. Then the patterned photoresist layer 135 is removed by a conventional stripping operation and the chrome layer 132 is removed resulting in the structure shown in FIG. 4F in which the substrate 131 now includes an opening which has a staircased or beveled edge as shown in FIG. 4F.

It will be appreciated for the process shown in FIGS. 4A through 4F, the etchant used to etch the substrate will depend upon the material of the substrate, and the masking layers will be designed to be resistant to those etchants. Typically, the second mask material, such as the photoresist layer 135 is patterned with a vertical etch. In one embodiment, the same lithographic mask which created the patterned layer 132 may be used to create the pattern in the photoresist layer 135 (although this is not shown in FIGS. 4B and 4D). The etch which creates the opening 137 may be a wet chemical etch (such as an etchant containing hydrofluoric acid) which is approximately two-thirds of the total etch time when the first etch to create the opening 134 was for one-third of the total etch time.

Figure 5A:
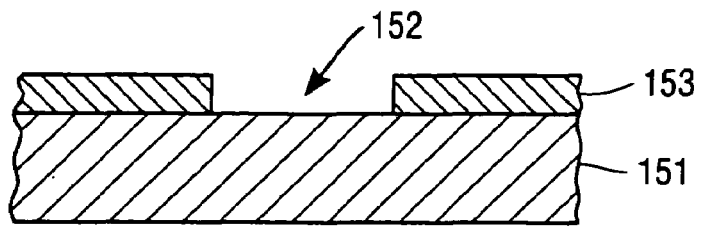
FIGS. 5A through 5F show in cross sectional views another method according to the present invention of forming openings in a receiving substrate.
Figure 5B:
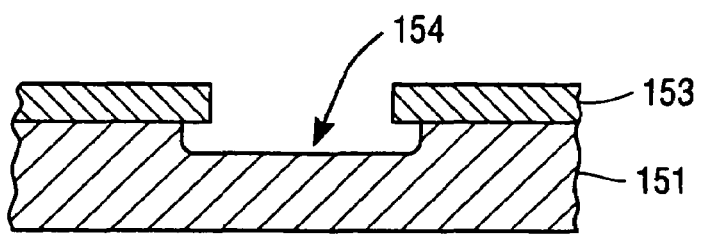
Figure 5C:
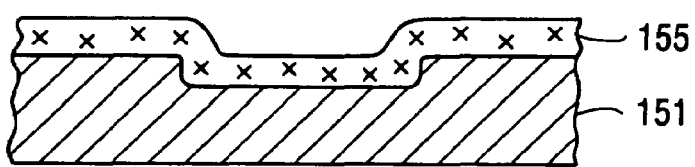
Figure 5D:
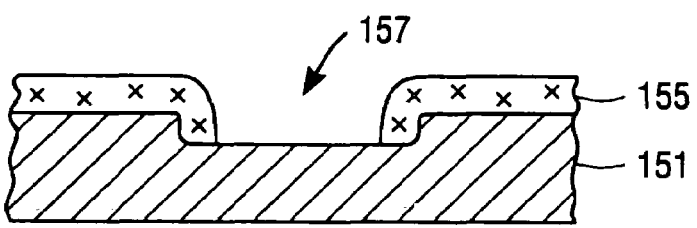
Figure 5E:
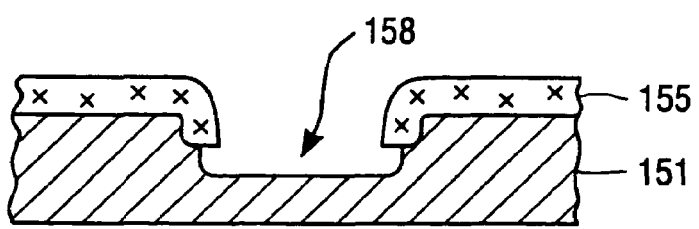
Figure 5F:
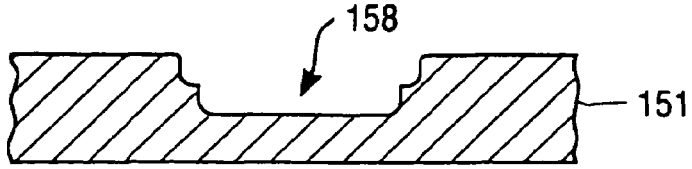

FIGS. 5A through 5F show another example of a method according to the present invention. The cross-sectional views through the substrate 151 shown in FIGS. 5A through 5F illustrate the structure of an opening as it is created using this exemplary method. It will be appreciated that a plurality of such openings are formed in the substrate 151 which may be an array of openings designed to receive separately fabricated elements which are assembled into the opening in subsequent processing. This is also true for the opening which is created using the other examples of methods of the present invention. FIG. 5A shows that a top region of the substrate 151 is exposed by an opening 152 in the patterned mask layer 153. In one embodiment, this patterned mask layer may be chrome or amorphous silicon formed by PECVD or CVD or sputtered amorphous silicon. The opening 152 is created using standard lithography techniques. This opening matches the shape of the desired hole. The substrate with the patterned mask 153 is then placed in a wet etch bath to create the opening 154. In one exemplary embodiment, a hydrofluoric acid etch etches the substrate 151 in its exposed regions to create the opening 154 as shown in FIG. 5B. In one example, this etch is for two-thirds of the total etch time, which total etch time includes the etching through the opening 157 to create the opening 158 as shown in FIGS. 5D and 5E.

After the opening 154 is created, a second mask material 155 is applied over the substrate 151 and into the hole 154 after the patterned mask layer 153 has been removed. This results in the structure shown in FIG. 5C. Then the second mask material 155 is patterned to create the opening 157, typically using a vertical illumination. This results in the structure shown in FIG. 5D in which the opening 157 exposes a bottom portion of the opening 154 as shown in FIG. 5D. Then another etch is performed through the opening 157 to create the opening 158 shown in FIG. 5E. In one particular embodiment, a hydrofluoric acid etch for one-third of the total etch is used to create the opening 158. Then the patterned mask material layer 155 is removed, which results in the structure shown in FIG. 5F. As can be seen from FIG. 5F, the opening 158 includes a beveled edge or a stairstep edge which provides for improved settling of elements into the hole and prevents lodging of inverted elements.

Figure 6A:
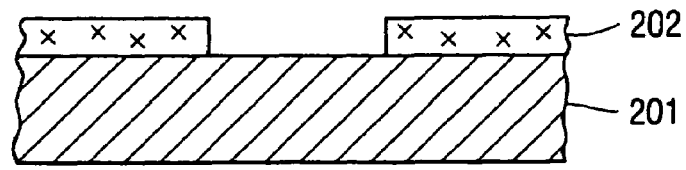
FIGS. 6A through 6F illustrate in cross sectional views another example of the present invention for forming openings in a receiving substrate.
Figure 6B:
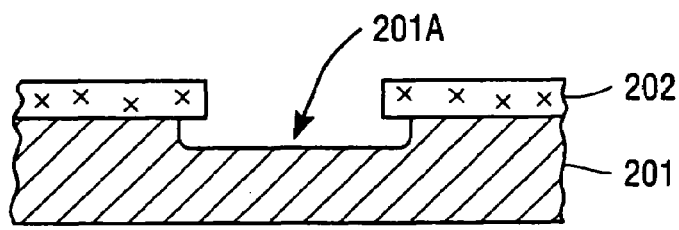
Figure 6C:
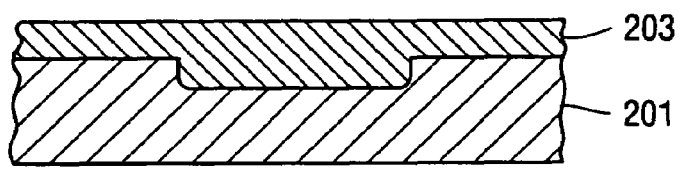
Figure 6D:
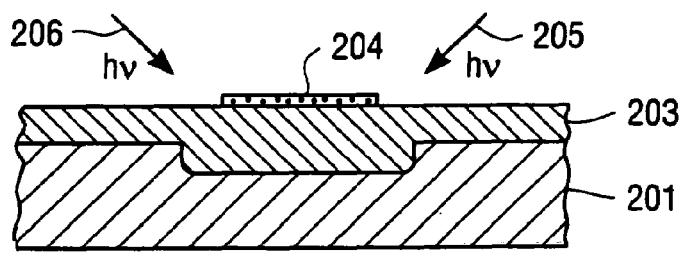

Another example of a method according to the present invention will now be described in conjunction with FIGS. 6A through 6F. A first mask material is applied on top of the substrate 201, and this first mask material is then patterned to create the first patterned mask 202 as shown in FIG. 6A. Then the substrate 201 is exposed to an etchant, which is typically a wet etch, which creates the opening 201A as shown in FIG. 6B. Then the patterned first mask layer 202 is removed and a photo-polymerizable layer 203 is applied over the entire substrate, filling the holes as shown in FIG. 6C. A second mask material is applied over the photo-polymerizable material 203, and this second mask material is patterned to create the opaque mask 204 which is shown aligned over the central region of the opening 201A. This can be seen from FIG. 6D. Also as shown in FIG. 6D, the opaque mask 204 is used to mask obliquely directed light 205 and 206 as shown in FIG. 6D. The obliquely directed light, obliquely directed from both sides of the opening as shown in FIG. 6D causes the light to pass partly under the mask 204. Because the mask 204 is opaque, some of the region under the mask 204 will not be exposed and another portion near the edges of the mask 204 will be exposed. It will be appreciated that four sources of light obliquely angled relative to the top surface 203 will typically be necessary in order to create an opening having four sides. The light will polymerize the photo-polymerizable material in all places where the material is exposed. Thus, the material which remained unexposed under the mask 204 will be etched away resulting in the opening 208 shown in FIG.

Figure 6E:
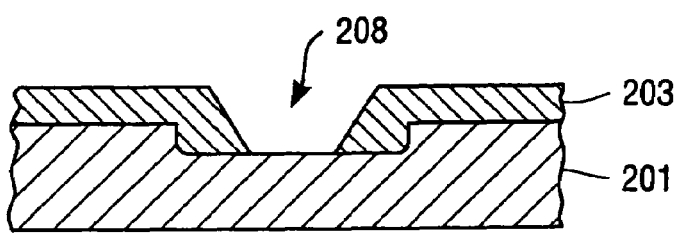
Figure 6F:
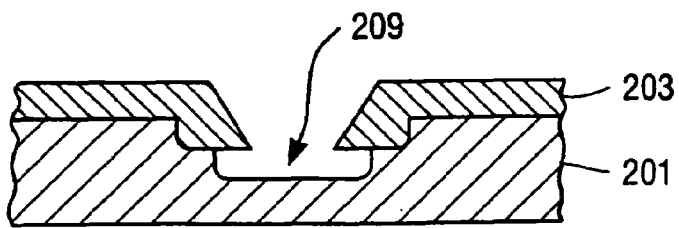

6E. The various materials and etchants which may be used will be apparent to those skilled in the art. For example, a photo-polymerizable polyimide may be used. The opening 208 forms a patterned layer 203 which exposes a portion of the bottom of the opening 201A as shown in FIG. 6E. This opening is then etched with an etchant, such as an etchant containing hydrofluoric acid when the substrate 201 is a glass. This etch process creates the opening 209 as shown in FIG. 6F.

Figure 7A:
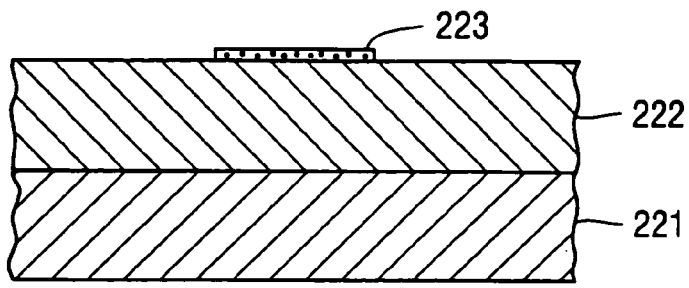
FIGS. 7A through 7E show in cross sectional views another method according to the present invention for forming openings in a receiving substrate.
Figure 7B:
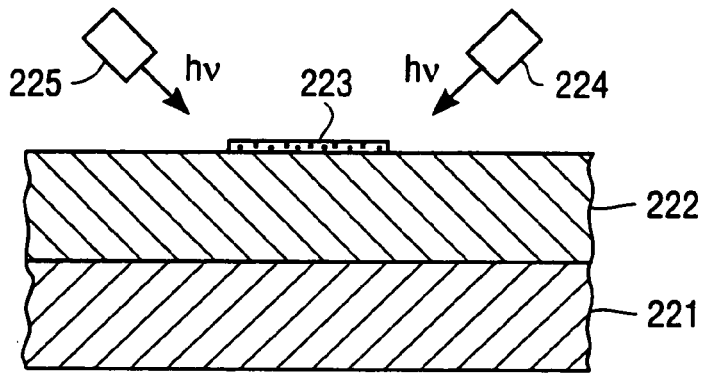
Figure 7C:
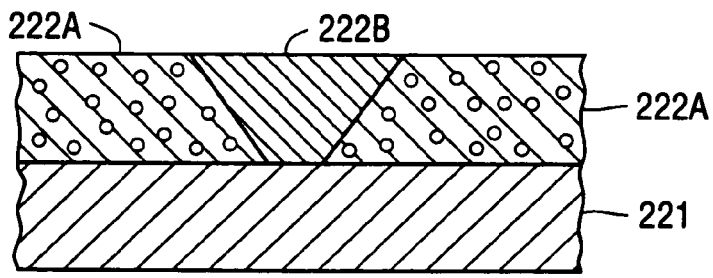
Figure 7D:
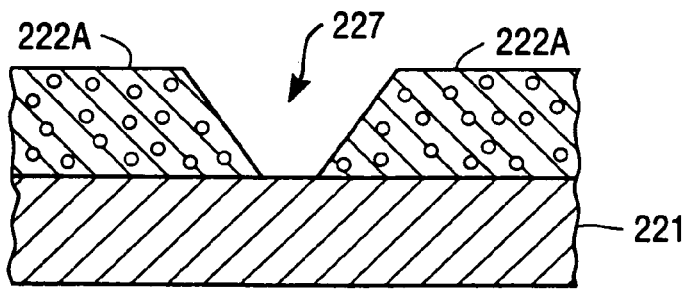
Figure 7E:
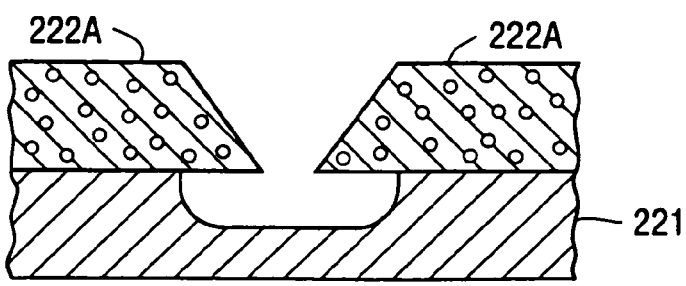

FIGS. 7A through 7D show an alternative embodiment in which the substrate 201 is not etched but the photo-polymerizable material 222 is etched after exposure to obliquely directed light as in the case of the method shown in FIGS. 6A through 6G. In the example of the method shown in FIGS. 7A through 7D, a patterned opaque mask 223 (or alternatively a contact mask) is placed on a photo-polymerizable material 222 which has been placed over the substrate 221. Then obliquely directed light 224 and 225 exposes the area surrounding the desired opening and a portion of the area under the mask 223 thereby causing these exposed regions to by polymerized as region 222A leaving the unpolymerized region that was not exposed as region 222B. Again, as in FIG. 6D, four sources of light obliquely angled relative to the surface will typically be necessary, however, two sources at either set of diagonally opposed corners of a rectangular mask is sufficient. FIG. 7C shows the result of the exposure after the mask 223 has been removed. Then the unpolymerized material 222B is removed using a conventional etchant which leaves the opening 227 as shown in FIG. 7D. The opening 227 in FIG. 7D may be directly used as the opening to receive separately fabricated blocks. Alternatively, the polymerized material 222A may be used as a mask to etch an opening in the substrate 221. Such an alternative result is shown in FIG. 7E where the polymerized material 222A is left to create a bevel around the top edge of the opening which now extends into the substrate 221.

Figure 8A:
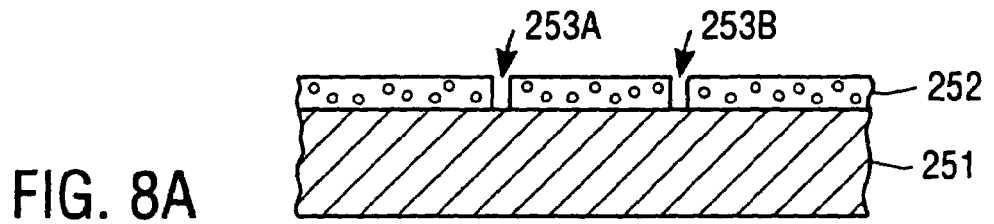
FIGS. 8A through 8F show another method for forming openings in a receiving substrate according to the present invention.
Figure 8B:
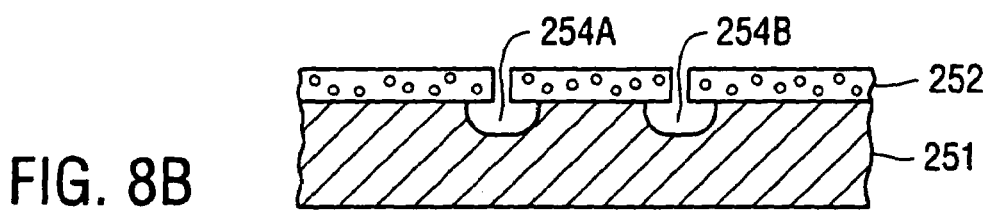
Figure 8C:
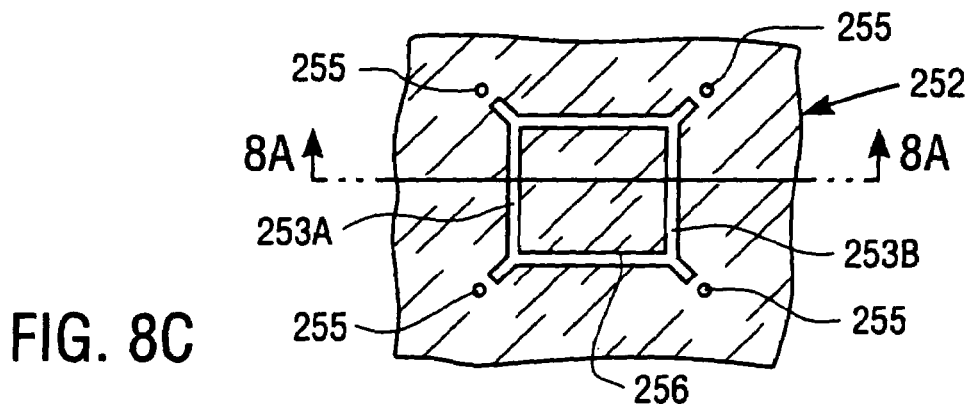
Figure 8D:
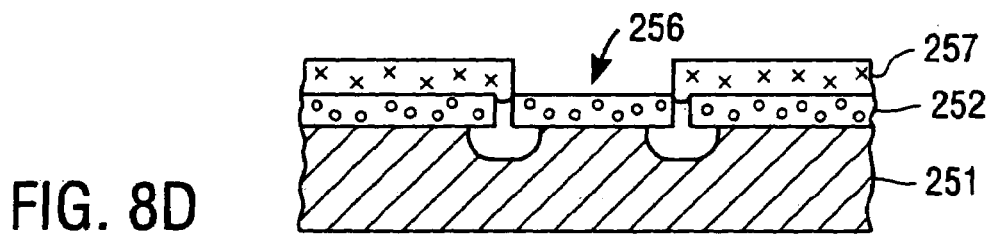
Figure 8E:
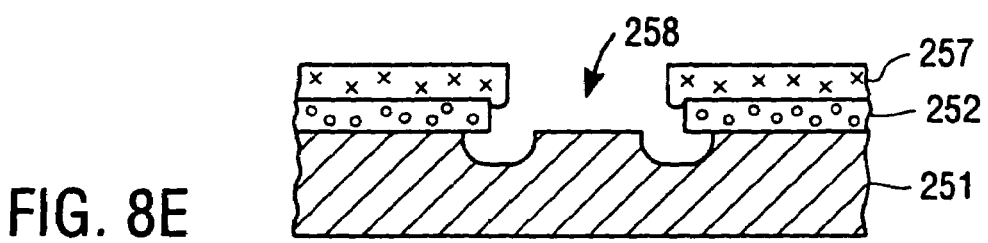
Figure 8F:
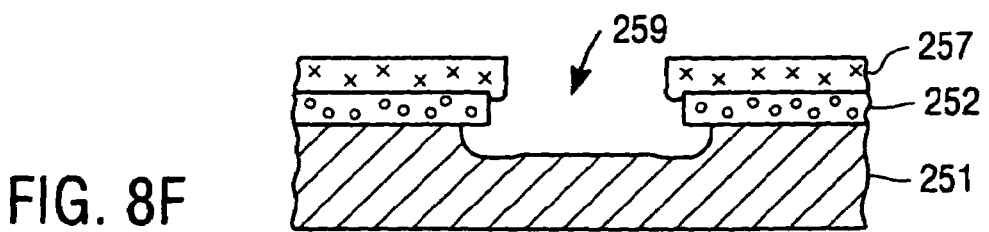

FIGS. 8A through 8F show another example of a method according to the present invention. A mask material is patterned over a substrate 251 to create openings which are thin slots. In one example, the mask material may be chrome which forms the patterned layer 252 with openings 253A and 253B. FIG. 8C shows an example of such a mask where the openings form a rectangle with protrusions from the corners and openings 255 which resemble pin-hole openings next to these protrusions at the corners. It will be appreciated that FIG. 8C is a top view of the patterned mask layer 252 and that these openings in the patterned mask layer 252 expose portions of the top surface of the substrate 251 which, in one embodiment, may be glass. The cross-sectional view of FIG. 8A is indicated on FIG. 8C. Through these openings, a wet etch is applied to the substrate 251 to etch the substrate a small amount, such as 2 microns. The resulting etch is shown in FIG. 8B in which the small openings 254A and 254B are created in the substrate 251. These openings surround the chrome island 256 shown from top view in FIG. 8C and from side cross-sectional view in FIG. 8D. A photoresist is then applied and patterned over the chrome such that only the center square 256 is exposed as shown in FIG. 8D. The patterned photoresist layer 257 is then used as a mask to etch the chrome island 256 resulting in the opening 258 as shown in FIG. 8E. Then the structure shown in FIG. 8E is etched again. In one embodiment, a wet hydrofluoric acid etch is used to etch into the opening 258 of the substrate 251. This creates the opening 259 shown in FIG. 8F. Then the patterned photoresist layer 257 and the chrome layer 252 are removed to produce the final hole.

Figure 1A:
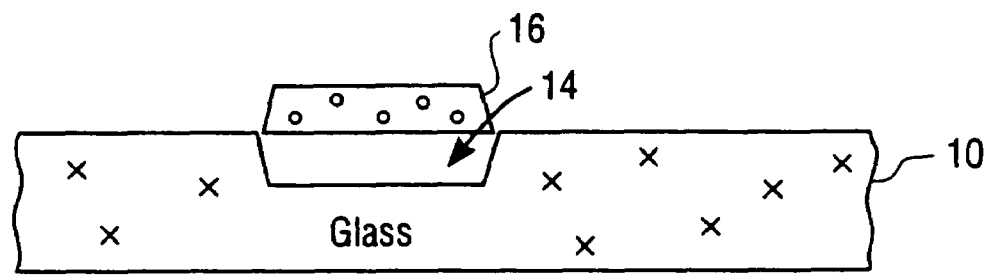
FIGS. 1A and 1B show examples of how a block can mate with an opening in a receiving substrate, which opening is designed to receive a separately fabricated element which includes at least one functional component.
Figure 1B:
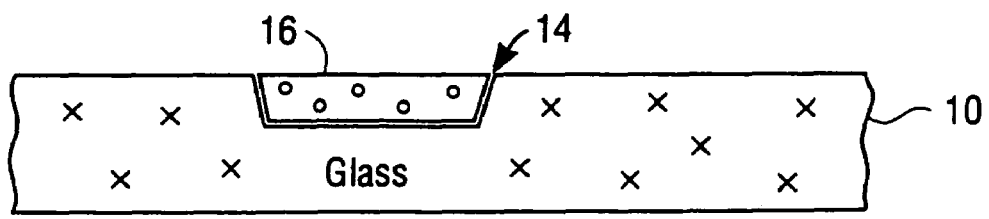
Figure 2A:
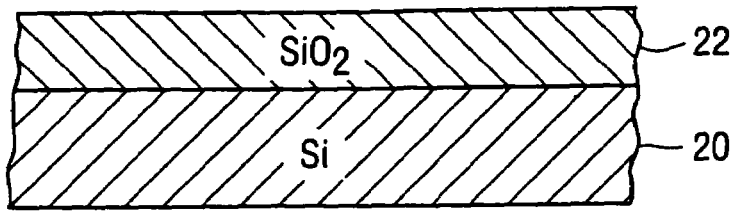
FIGS. 2A through 2D show another method in the prior art for forming openings in a receiving substrate.
Figure 2B:
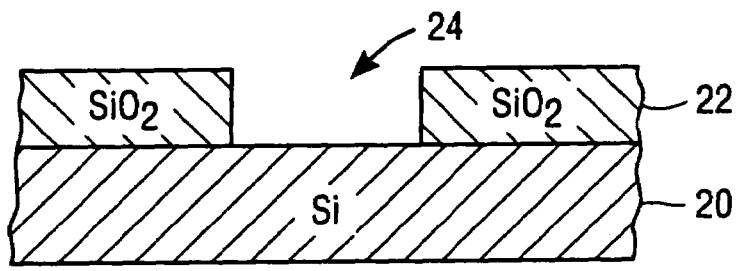
Figure 2C:
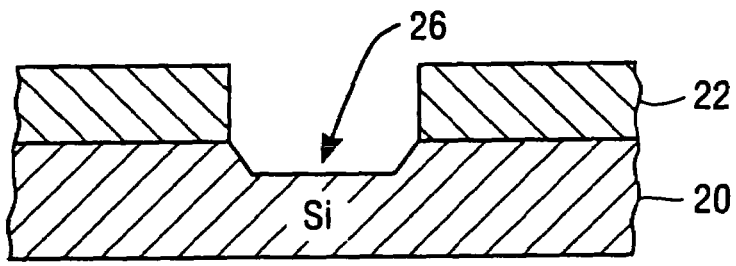
Figure 2D:
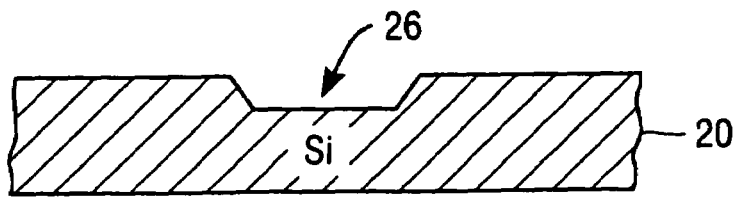

The various different methods of the present invention will typically create an array of openings on a receiving substrate. These openings are then filled with a plurality of elements, each of which typically include at least one function component, such as a pixel driving circuit for driving a liquid crystal cell in an active matrix liquid crystal display or other display driving elements for other types of displays. Co-pending U.S. patent application Ser. Nos. 09/251,220 now U.S. Pat. No. 6,291,896 and 09/251,268 now U.S. Pat. No. 6,606,079 filed Feb. 16, 1999 by John Stephen Smith and assigned to the same Assignee of the present invention describe an example of the electrical circuitry disposed on each element which is to be assembled into an opening. These co-pending applications are hereby incorporated herein by reference. Generally, these elements resemble tapered blocks having a trapezoidal cross-section where the top of the block is wider than the bottom of the block. An example of such a block is shown as block 16 in FIG. 1D. Various improved methods for forming these blocks are described in co-pending U.S. patent application Ser. No. 09/433,605 now U.S. Pat. No. 6,420,266, which was filed concurrently herewith by John Stephen Smith, Mark Hadley and Jay Tu which is assigned to the same Assignee as the present invention and which is entitled "Methods for Creating Elements of Predetermined Shape and Apparatuses Using These Elements" and which is hereby incorporated herein by reference. In one preferred embodiment, the electrical circuits are fabricated as described in U.S. patent application Ser. Nos. 09/251,220 and 09/251,268 in blocks which are fabricated as described by the U.S. patent application entitled "Methods for Creating Elements of Predetermined Shape and Apparatuses Using These Elements." FIGS. 9A through 9D will now be referred to in describing one example of a method of assembling the blocks into the openings in order to create a completed assembly.

FIG. 9A shows a generalized flowchart indicating the various processing operations which are performed to create the completed assembly in which the blocks or elements are assembled into the openings in the receiving substrate. In processing operation 301, blocks having a predetermined shape are prepared. In one particular example, an integrated circuit is fabricated into each block and each block is extracted from a first substrate which may be a single crystal semiconductor substrate, such as a monocrystalline silicon wafer. Separately, in step 303, the openings for the blocks are prepared in a second substrate. Processing operation 303 may employ any of the previously described methods of the present invention in order to form openings having a desired shape which is designed to match the predetermined shape of the blocks formed in processing operation 301. In step 305, the blocks are assembled into the openings. In one example, the blocks may be assembled by a pick and place method as described above. In a preferred embodiment of the present invention, fluidic self assembly is used to assemble the blocks into the openings. Fluidic self assembly in one example of the present invention may use a slurry of the blocks which are carried in a fluid, such as acetone or water with a surfactant or other types of fluids, including gases or vapors. Agitation and fluid flow to move the blocks over the receiving surface may be used. When a block encounters an opening, it falls into it and is held there. Blocks that do not encounter an opening simply slide off the substrate. Eventually, the substrate contains only blocks that are in holes. If any empty holes remain on the substrate, a second dose of block slurry can be deposited on the substrate to fill those holes. Once the desired percentages of holes has been filled, a binding agent may be added and the slurry solvent, such as acetone, is evaporated.

In processing operation 307, the assembly is planarized. In one example, the substrate with the blocks is spin-coated with partially polymerized benzocyclobutene to a uniform thickness of greater than 2 microns. This planarization layer is then cured. FIG. 9B shows an example of a block, referred to as silicon block 325 having an active device layer 327 at the top surface of the block 325. The block sits securely in the opening 323 in the glass substrate 321. The planarization material is shown in FIG. 9C as material 329 which fills the gaps in the opening 323 and also coats the upper surface of the glass substrate 321 and covers the block 325 and the active circuit layer 327.

Vias are then etched in the planarization layer and electrical connections are made to bonding pads on the integrated circuit in the active circuit layer 327. Processing operation 309 as shown in FIG. 9A may include other methods for interconnecting the various blocks in the various openings along the substrate. In the case of an array of display elements, metallization is applied into the vias 331 in order to make contact to bonding pads on the active device layer 327 of the block 325. These patterned metal layers, such as metal lines 333A and 333B, serve to interconnect the blocks electrically. For example, these metal lines (or non-metal conductive lines) may represent a row line for a row of pixels or may represent a column line for a column of pixels as is well known in the art of fabricating active matrix liquid crystal displays.

The Fluidic Self Assembly (FSA) process can be performed in a variety of conditions, with a variety of fluids. Proper selection of the block and substrate surface chemistry as well as the fluid to be used results in faster, higher yielding assemblies with dramatically fewer excess blocks left on the surface prior to rinsing, inspection, and repair. The surface chemistry interaction with the fluid effectively reduces the amount of friction between the blocks and the substrate. The choice of block surface chemistry, substrate surface chemistry, and fluid are all usually interrelated. For example, hydrophobic surface chemistries work much better with organic fluids than with aqueous solutions. The treatment of the surfaces usually, but not necessarily, alters both sets of surfaces so that they are of the same type. For example, both the elements and substrate may be treated to have a hydrophilic surface and the elements, so treated, may be dispersed in a polar solvent (e.g. $H_2O$) and then dispensed over the so treated substrate in an FSA process. In an alternative example, both the elements and the substrate may be treated to have a hydrophobic surface and the elements and substrate, so treated, may be combined in a solvent (e.g. hexane) which is non-polar in an FSA process.

In the case of the block surface chemistry, any surface treatment that cleans the surface of the block results in improved FSA's. A surface treatment fluid may be in a liquid form, a gas form or a plasma form. The improvement is more significant if the surface treatment leaves a desired, uniform surface chemistry on all of the blocks for a given assembly. Hydrophilic surface chemistries can be achieved by rinsing the blocks in any oxidizing solution, such as aqueous $KMnO_4$, $H_2SO_4$ with $H_2O_2$, $NH_4OH$ with $H_2O_2$, or ozonated deionized water or by exposing the blocks to an oxygen plasma. The surface chemistry is more uniform if the blocks can be agitated while being immersed in one of the preceding chemistries. The agitation could be caused by a variety of systems, such as from a recirculating fluid flow, from a megasonic or ultrasonic bath, or by stirring. Hydrophilic surfaces with good uniformity can be achieved by oxidizing the surfaces and reacting a functional, self-assembled monolayer onto the surface, and then oxidizing the functional group in the self-assembled monolayer. For example, octenyltrimethoxysilane could be reacted onto block surfaces cleaned by oxidation with $H_2SO_4$ and $H_2O_2$. The alkene group can then be oxidized into a hydrophilic functional group by treatment with a mild, aqueous $KMnO_4$ solution.

Hydrophobic surfaces on blocks can be created by cleaning and oxidizing the blocks as described above, and then reacting a self-assembled monolayer onto the surface, such that the hydrocarbon chains of the self-assembled monolayer are topmost at the surface. Typically the contact angle of water on these hydrophobic surfaces is at least 90 degrees. Teflon, which can be deposited or formed on the surfaces of the blocks, will also act to create hydrophobic surfaces on the blocks. Other types of coatings of a hydrophobic nature may be used or a fluorine plasma may be used to create hydrophobic surfaces on the blocks.

The substrate surface treatment is analogous to the block surface treatment. It is possible to perform fluidic self-assemblies in which the block receives one surface treatment, and the substrate receives a different surface treatment. For example, the substrate may be exposed to a surface treatment fluid which creates a metal coating (film) on the surface of the substrate (a hydrophilic surface normally) or a surface treatment fluid which is an oxygen plasma (to create a hydrophilic surface) or a surface treatment fluid which oxidizes a coating (or otherwise creates an oxidized coating) on the substrate while the blocks are exposed to a surface treatment fluid which is dissolved ozone in water. Alternatively, the same surface treatment fluid (e.g. an oxygen plasma) may be used on both the blocks and the substrate. It is also possible to pattern the surface treatment on the substrate, such that the surfaces in the bottom of the receptor sites are hydrophilic, and the rest of the substrate is hydrophobic, for example.

As mentioned above, the choice of fluid for any given FSA depends on the surface chemistry of the blocks and the substrate. Assemblies processed with hydrophobic surface chemistries (e.g. the blocks and substrate have each been exposed to surface treatment fluid(s) which have created hydrophobic surfaces on the blocks and the substrates) proceed more rapidly if an organic solvent, such as toluene or hexane, is used as the slurry fluid in the FSA process. Conversely, if the blocks and substrate are hydrophilic (because the blocks and substrate have been exposed to surface treatment fluid(s) which have created hydrophilic surfaces on the blocks and the substrate), water or hydrophilic solvents such as acetone (or other polar or water soluble solvents) are more appropriate as the slurry fluid in the FSA process.

A preferred method of surface treatment for the block devices is to oxidize the surface with a dilute aqueous solution containing 0.008% potassium permanganate, 0.025% sodium periodate, and 0.415% potassium carbonate. The block devices are stirred in the oxidizing solution at 75° C. for 2 hours. The preferred method for stirring the block devices in the solution is to separate the block devices from the stirrer by a stainless steel sieve material. After 2 hours of exposure to the oxidizing solution, the block devices are collected on the sieve, and rinsed in a 0.3M aqueous sodium bisulfite solution. Then the devices are rinsed in a 0.1M solution of acetic acid. Finally, they are rinsed in DI (deionized) water.

The most preferred method is to oxidize the block devices while they recirculate in a solution of 5 to 125 ppm dissolved ozone in DI water. The most preferred ozone concentration is in the range of 50–125 ppm dissolved ozone. The block devices are recirculated for 1 hour, rinsed in DI water, and then transferred to the slurry fluid prior to fluidic self assembly.

The most preferred method for treating a glass or silicon substrate is to place the substrate in a mix of 95 parts concentrated sulfuric acid and 5 parts hydrogen peroxide for 10 minutes. The substrate is then rinsed in DI water prior to fluidic self assembly.

A preferred treatment for treating plastic substrates (e.g. a flexible plastic substrate) is to expose them to gaseous ozone for 5 minutes. The most preferred method for treating a plastic substrate is to expose the substrate to an oxygen plasma for 1 minute prior to fluidic self assembly.

Besides surface interaction, the optimal fluids for FSA have low viscosity and can be used safely. It is possible to add reagents to the fluid to improve the FSA process. For example, surfactants or certain water soluble polymers can be added to water to reduce the block-substrate interaction, thereby reducing the number of excess blocks left on the substrate at the end of an assembly. If a polymer is used, it is desirable that the polymer serve as a lubricant while dissolved. Preferred polymers would consist of water soluble polymers such as Union Carbide Polyox (polyethylene glycol) or DuPont Elvanol (polyvinyl alcohol). If a surfactant is used, it is preferable to use a non-ionic surfactant so that the circuitry is not damaged by counterions in the surfactant. The surfactants normally have a molecular form which includes a hydrophobic portion and a hydrophilic portion; often, the non-ionic surfactant will include a hydrophilic portion which is an ethylene oxide oligomer. In a preferred method, a non-ionic surfactant such as Union Carbide MinFoam 1X or Triton 190 or DuPont Zonyl FS-300 is used in water to perform fluidic self assembly of blocks which have been surface treated with aqueous $KMnO_4$ (or ozonated water) on a glass substrate that was oxidized with $H_2SO_4$ and $H_2O_2$. In this case, the water and surfactant and the blocks form the slurry for the FSA process, and the slurry is dispensed onto the pretreated substrate. Typically, the substrate is immersed in the FSA fluid (e.g. water in the immediately preceding example) which is the same as the fluid used to create the slurry having the blocks, and the slurry is added to the substrate while it is immersed in the FSA fluid. The substrate may be immersed in exactly the same fluid and a surfactant as the fluid and surfactant which make up the slurry.

Once the blocks and the substrate are prepared in the desired manner (e.g. the desired surface treatments have been completed), and the appropriate carrier fluid is selected, the blocks can be deposited onto the substrate in a number of ways. They can flow down an inclined tube containing the fluid so that they fall through the FSA fluid and onto the substrate. One or a plurality of these tubes can be used to deposit the blocks onto the substrate. Also, the tube or tubes can be moved across the substrate such that the entire substrate can be covered with block slurry prior to or during assembly. In another embodiment, the blocks could be carried through a tube or a number of tubes by a fluid flow that is either laminar or turbulent. The flow(s) could effectively spray the block slurry over the substrate to cover a selected portion of or the entire substrate. The aforementioned tubes could be circular, fan-shaped, or have a multitude of ports.

The fluidic self assembly process can be accomplished in a variety of methods. The blocks can be moved across the substrate surface in a number of ways, including forced fluid flow, suction, gravity, magnetic fields if the blocks have magnetic characteristics, or any combination of these driving forces. Forced fluid flow can drive the blocks across a tilted or horizontal substrate either by providing a uniform flow over the surface, or by using a very localized flow that can be directed in any desired manner. A magnetic field applied to magnetized blocks could draw the blocks into the receptor sites. Suction could be applied to holes located in the bottom of the receptor sites that go through the substrate to a vacuum source on the other side of the substrate. Gravity is used by tilting the substrate from horizontal to an angle not greater than 55 degrees. The blocks then slide down the substrate under the force of gravity. In a preferred embodiment, the tilted substrate is vibrated to drive the blocks down the substrate. The vibration frequency ranges from 50 Hz to 10,000 Hz, and can have a square, sine, sawtooth, or any other waveform. The direction of the vibration is in one embodiment transverse to the direction of the block slurry flow down the tilted substrate. In some instances it may be desirable to have components of the vibration in the direction of the block flow down the substrate, and in the direction normal to the substrate.

Once the blocks are moving across the substrate, the fluidic self assembly can proceed by either allowing all of the excess blocks (blocks that do not fill a receptor site) to move completely off of the substrate, or by forcing excess blocks to move off of the substrate. The excess blocks can be driven off of the substrate with fluid flow over the substrate, by altering the conditions of the vibration applied to the substrate during the assembly, by increasing the angle of inclination of the substrate, by suctioning off blocks, or by any combination of these methods.

Figure 11A:
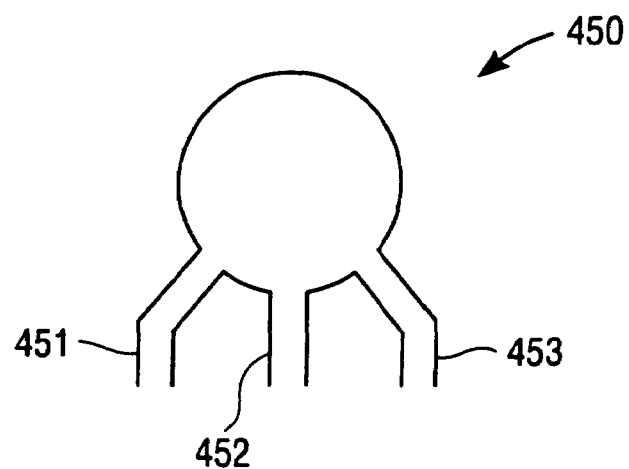
FIGS. 11A and 11B show two examples of nozzles which may be used to dispense a slurry of blocks onto a receiving substrate.
Figure 11B:
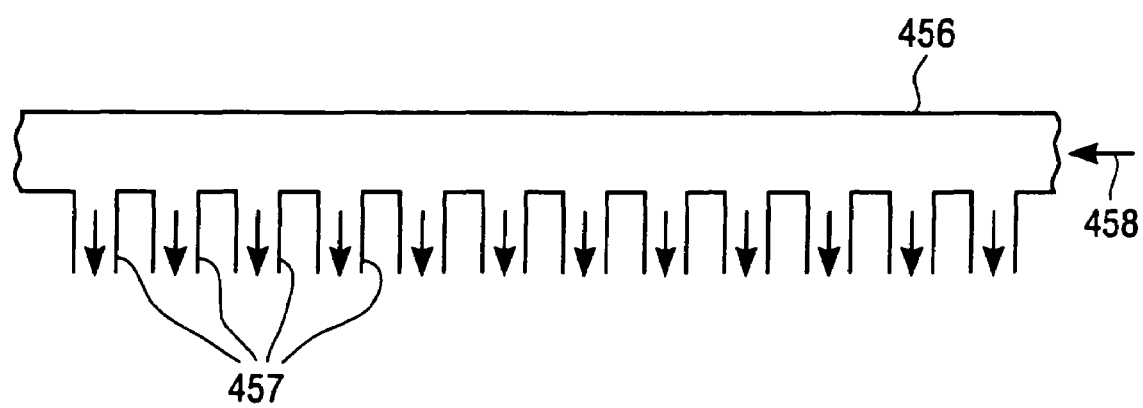

The fluidic self-assembly process can be accelerated in a number of ways in addition to proper selection of the process parameters listed above. One method for speeding up the FSA process is to deposit blocks regularly or uniformly over the entire surface. This deposition process could result in a uniformly dense layer of blocks across the surface. This could be accomplished by spraying the block slurry across the substrate with one or more deposition nozzles. If desirable, the nozzle(s) could be designed to sweep across the surface to achieve more uniform coverage. Alternatively, the blocks could be deposited in selected areas of the substrate. These blocks could be placed by one or more fixed or movable deposition nozzles that deliver the blocks with the assistance of some combination of fluid flow, gravity, and vibrational impulse. Placing the blocks uniformly or regularly over the substrate surface accelerates the overall FSA process because less time is required for the blocks to move over the entire substrate. For example, if 10 rows of blocks are deposited regularly over the substrate surface, the blocks will only have to move one-tenth the distance across the substrate as compared to the case in which just one row of blocks is placed at the top of the substrate. Once a sufficient number of blocks has covered the areas of the substrate containing the receptor sites, such that the desired number of the receptor sites are filled, the excess blocks can be forced off of the substrate. FIGS. 11A and 11B show two examples of nozzle heads which include at least one nozzle. Nozzle head 450 includes three nozzles 451, 452 and 543. Each nozzle 451, 452 and 453 may be coupled to receive the same fluid (e.g. a slurry with blocks) or different fluids (e.g. one nozzle ejects a slurry with blocks, one nozzle ejects "helper" blocks (described below) in a fluid, and another nozzle may create a vacuum to be used to remove excess blocks after depositing blocks and allowing them to settle/self-assemble into openings). Nozzle head 456 includes many nozzles 457 disposed along a row; these many nozzles are designed to eject a fluid (e.g. a slurry with blocks and/or helper blocks) or to draw a vacuum. Several nozzle heads 456 may be disposed above a substrate to uniformly and concurrently deposit blocks onto the substrate.

The excess blocks can be removed from the substrate by the methods listed above. The excess block clearing process can be accelerated with the addition of components designed to push blocks off of the substrate. Any combination of a number of different components could accomplish this task. One component that can increase clearing is a wiper blade that moves across the substrate. Blocks that are in receptor sties will be unaffected, but blocks on the surface will be swept away by the wiper blade. Alternatively, a brush could be used in place of or in addition to the wiper blade. The components that clear excess blocks from the surface could be one or more large items, relative to the size of the blocks, that move down the substrate with the blocks, pushing blocks down and off the substrate as they move. These items may be referred to as helper blocks. Because these items are normally significantly larger than the blocks, gravity will drive them down the substrate faster than the blocks, and they will be able to push a large number of the blocks off of the substrate as they move down. These relatively large items could be glass, plastic, or metal balls, cylinders, or rectangular solids. More preferably, these items could have the same approximate shape as the blocks (but larger in size), or they could be shaped pieces of material that are designed to contact the substrate only where there are no receptor sites. Most preferably, these helper blocks could be rectangular pieces made of magnetic stainless steel. After removing the excess blocks from the surface, these items could be recovered and readily separated from the excess blocks by sieving or some other particle separation method or separated with a magnetic field in the case where the helper blocks are magnetic (e.g. the helper blocks are comprised of magnetic material).

After the excess blocks have been removed, the substrate can be inspected for faults such as empty holes or blocks that have not seated properly in their receptor sites. Empty sites can be filled by placing a small number of blocks in a slurry form and depositing this slurry on or above the empty site, and forcing or allowing the blocks to fill the empty site(s) by means analogous to those used to perform the assembly. Empty sites can also be repaired by a pick-and-place process, in which an individual block is placed in an individual receptor site. A receptor site with an improperly seated block can be repaired by removing the block with either suction, fluid flow, or mechanical means, and then filling the now empty receptor site as described above. Alternatively, blocks that are tilted or rotated in their receptor site could be repaired after the assembly is complete with a hot press process.

Once all desired repairs have been made, the blocks may be bonded into their receptor sites with an organic or polymeric agent that serves as an adhesive in this application. The bonding agent could be dissolved into the original FSA fluid prior to the start of the assembly, or it could be added any time later during the assembly, assuming that the bonding agent is compatible with the fluid used for the assembly. If the bonding agent is incompatible with the fluid used for the assembly, a fluid displacement process can be used at any time after the start of the assembly to replace the first fluid with a second fluid which is compatible with the bonding agent. In one example, acetone is used as the FSA fluid, and a water soluble polymer is used as the bonding agent. After completion of the inspection and repair process, water is added to the system and acetone is removed at approximately the same rate, until there is a sufficient percentage of water in the resulting water/acetone mix such that the bonding agent is soluble in the mix. In a different example, the FSA is performed in toluene containing benzocyclobutene oligomers which serves as a bonding agent. In another example, the FSA is performed in basic water that contains surfactant and a water soluble polymer that serves as the bonding agent. Alternatively, the FSA can be performed in water containing surfactant, and then a water soluble bonding agent dissolved in water can be added to the water/surfactant mixture. Typically the completed assembly is left immersed in the bonding solution for 5–30 minutes to allow the bonding agent to diffuse around the blocks in the receptor sites. At this time, if the substrate were tilted it is preferable to reduce or eliminate the angle of inclination, and, in some cases, to apply a low amplitude vibration to the substrate while the angle of inclination of the substrate is being decreased.

After the filled substrate has remained immersed in the bonding solution for the desired length of time, the substrate is either lifted out of the solution, or more preferably, the solution is drained away or evaporated from the substrate. Then the substrate is allowed to dry, either by free or forced convection. During the drying process, it is beneficial to tilt the substrate slightly, so that excess fluid does not pool and dry in the array of blocks.

Once the substrate is dry, the fluidic self assembly process is complete. At this time, if necessary, repair of blocks that are tilted in their receptor sites can be accomplished with the use of heat and mechanical pressure in a number of different ways. The substrate can be heated to a temperature that softens the bonding agent, and then pressure can be applied either locally with a point source, more globally with a roller apparatus, or globally with weight or other form of applied pressure. In this step it is important that the surface pressed against the filled substrate will not stick to the blocks in the receptor sites or to the substrate. In one example, Solutia Scripset 550 was used as the bonding agent, the substrate was heated to 120° C., and then pressed between perfluoroalkoxy polymer films with approximately 500 psi for 1 minute. The substrate is then cooled while under pressure. The pressure is released and the perfluoroalkoxy films were removed. In another example with the same bonding agent, a Teflon roller, made out of Teflon tubing placed over a steel rod, was rolled across the substrate after it was heated to 120° C. Both of these processes reduced the number of tilted blocks that remained after the completion of the FSA.

After the completion of the FSA, and the press repair if desired, the residual bonding agent that remains on the surface of the substrate can be removed with an oxygen plasma descum without damaging the bonding of the blocks in their receptor sites. At this point, the substrate is ready for planarization and the rest of the down stream processes required to electrically interconnect the blocks and construct an electrical apparatus.

Figure 10:
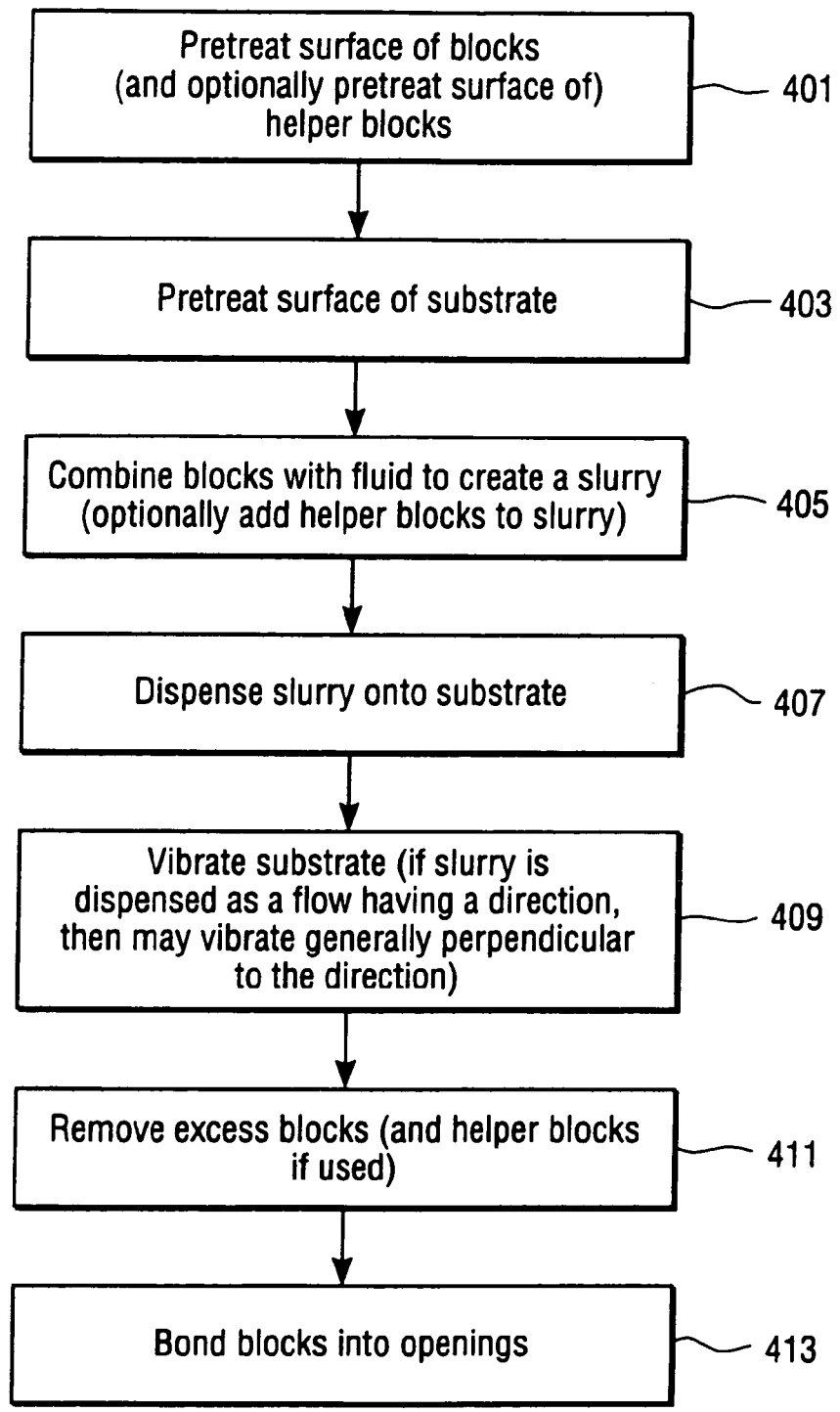
FIG. 10 shows a flowchart which indicates a method for creating an assembly of blocks and a receiving substrate which receives the blocks into openings on the receiving substrate.

FIG. 10 shows a flowchart of an exemplary method of the invention which includes the pretreatment of the blocks and the substrate and the bonding of blocks into openings as described above. This FIG. 10 also optionally uses helper blocks to facilitate movement of the blocks across the substrate during the FSA process. Operations 401 and 403 include the pretreatment of the surfaces of the blocks and the substrates. Alternatively the fluid used in operation 405 may be used to pretreat the blocks' surfaces. In operations 407 and 409 the FSA process occurs, and excess blocks (and helper blocks if used) are removed in operation 411. Then the blocks are bonded into the openings (after use of a roller as described above) in operation 413. A repair process may be used as described above and then the substrate is processed in further down stream processes (e.g. planarization and electrical interconnection) in order to create a functional device, such as an active matrix flat panel display.

Figure 9G:
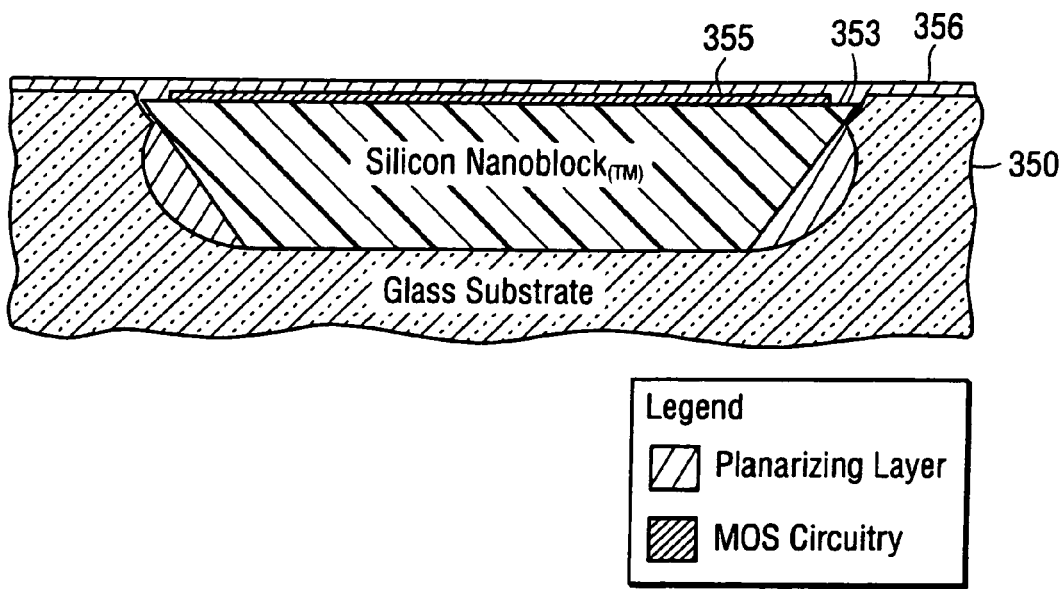
Figure 9H:
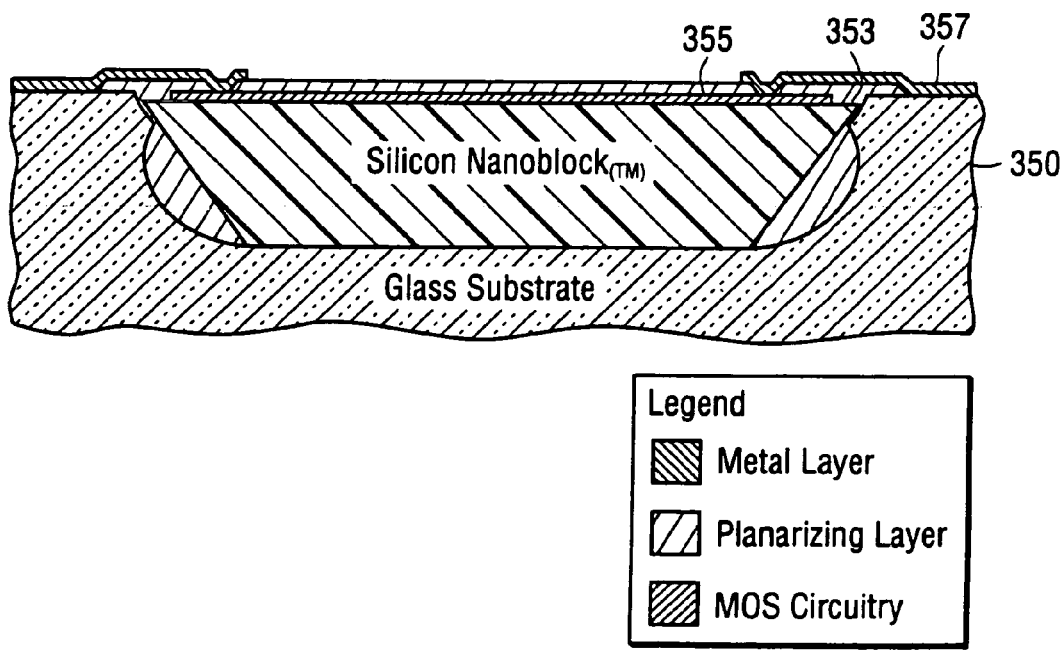
Figure 9I:
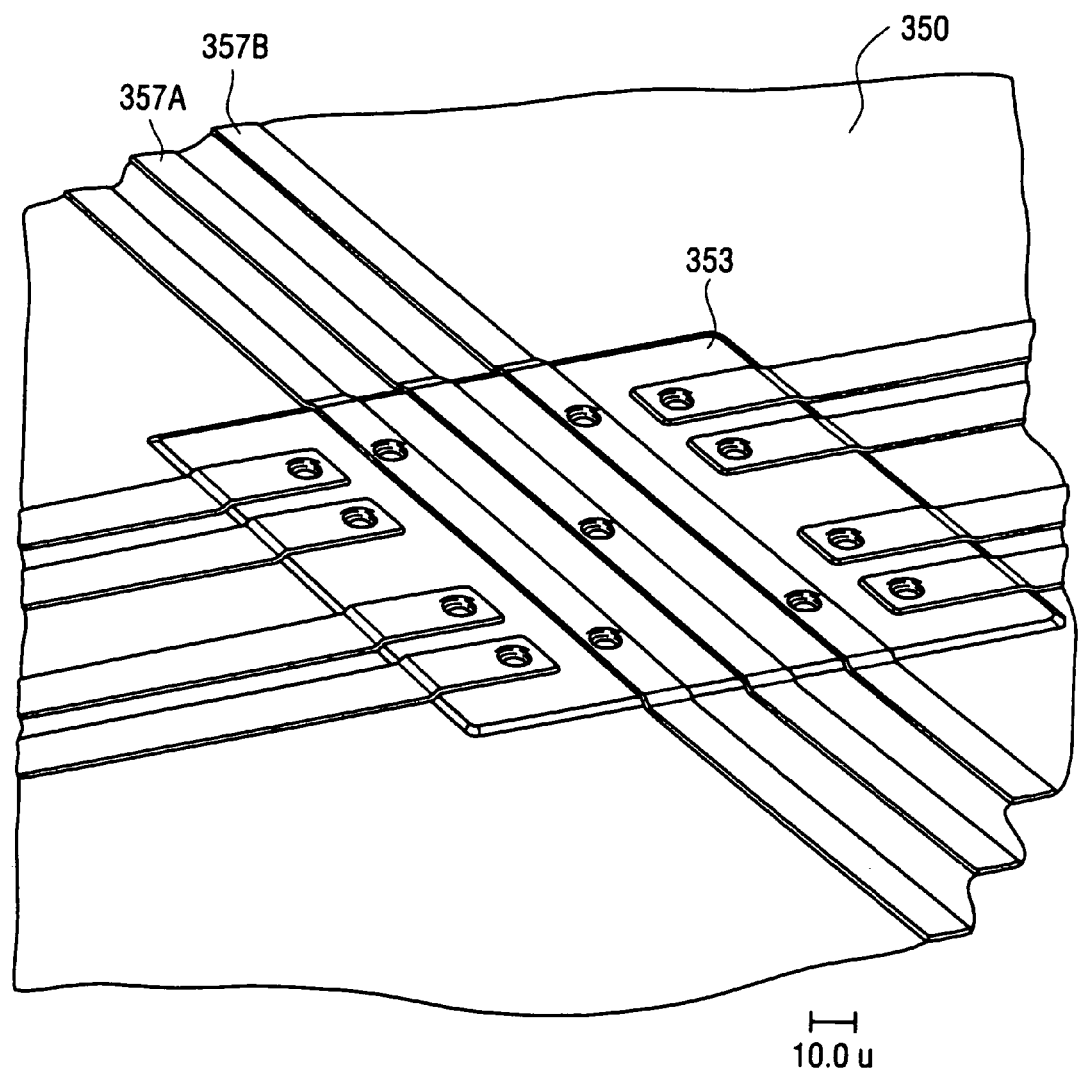
FIG. 9I is a perspective electron micrograph image of a silicon block which has been placed into an opening in a substrate, and electrical interconnects have been formed to the silicon block.

FIGS. 9E, 9F, 9G, 9H and 9I show the result of an FSA process which fills an opening created using a method according to the process illustrated in FIGS. 3A–3G. FIG. 9E begins with the opening 351 in a glass substrate 350. A block (shown in this case as a silicon Nanoblock 353, where Nanoblock is a trademark of Alien Technology, Inc.) is assembled through an FSA process (e.g. the method of FIG. 10) into the opening 351 as shown in FIG. 9F. The top portion of block 353 includes the functional component (in this case MOS circuitry, such as CMOS pixel drivers and electrode(s)) for the block. Then, as shown in FIG. 9G, a planarizing layer 356 is applied. The planarizing layer may be applied after a bonding solution is used to bond the block to the opening. A patterned metal (or other conductive material) layer 357 is then created to electrically interconnect the block's functional component to other blocks or to other functional components. FIG. 9I shows an electron micrograph of a block 353 in a substrate 350 after electrical interconnects 357a and 357b have been applied. Normally, many such blocks may be formed in a matrix to create, for example, the backplane of an active matrix flat panel display, such as an active matrix liquid crystal display.

Figure 12A:
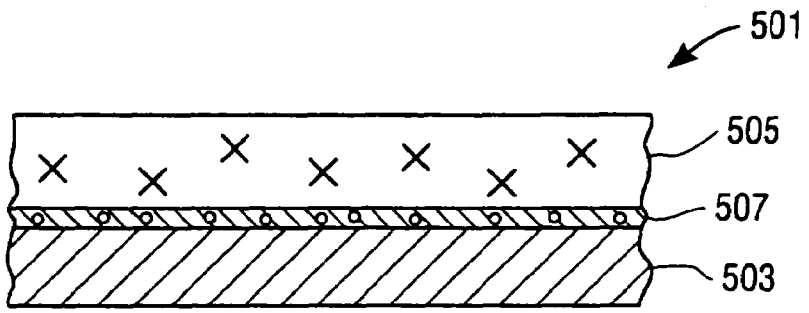
FIGS. 12A and 12B are cross-sectional views of a substrate in which an opening is created according to another method of the present invention.
Figure 12B:
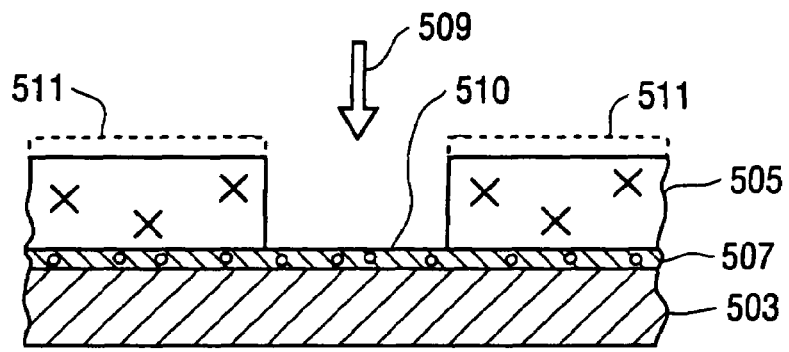

An exemplary method according to another aspect of the invention will now be described in conjunction with FIGS. 12A and 12B. FIG. 12A shows an assembly 501 of a substrate 503 with a reflective layer 507 and an ablatable layer 505. The substrate 503 may be a glass layer or a plastic layer which is flexible. The reflective layer 507 may be an aluminum foil layer which is also flexible, and the ablatable layer 505 may be an organic polymer or other substances which may be removed (e.g. by evaporation through exposure to selectively located heat). The ablatable layer 505 is exposed at desired locations to a laser beam 509 which removes the ablatable material at the exposed portions, thereby creating the opening shown in FIG. 12B. The opening is created to the point at which the reflective surface 510 of the foil is reached. Thus, the ablation process stops automatically at the reflective surface 510. This will produce uniformly deep openings when the ablatable layer has a uniform height across the surface of the foil. The opening may then be used as described above in an FSA process.

Figure 13A:
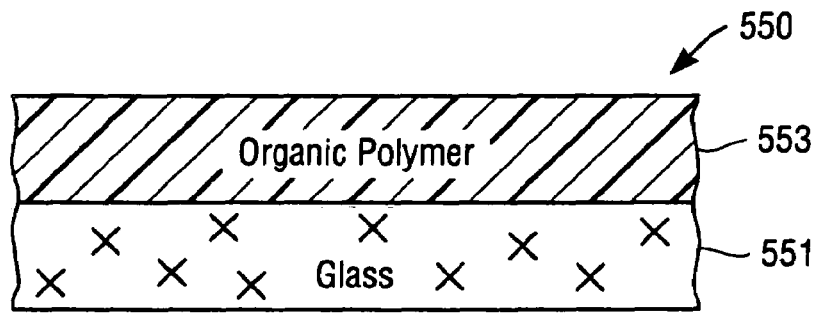
FIGS. 13A and 13B are cross-sectional views of a substrate in which an opening is created according to another method of the present invention.
Figure 13B:
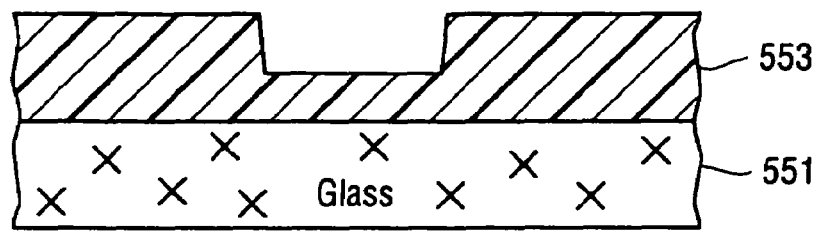

An exemplary method according to another aspect of the invention will now be described in conjunction with FIGS. 13A and 13B. A completely different approach to making block receptor sites on a glass substrate is to form the holes in an organic layer coating a glass substrate. This offers many advantages over etching holes directly into the glass. The receptor site fabrication process may be faster and easier on an organic layer than on glass. It will also yield receptor sites that are better in the sense that they more accurately match the size and shape of the nanoblocks. FIG. 13A shows an assembly 550 having an organic layer 553, which may be thin relative to the glass layer 551. The opening is then formed to produce the structure shown in FIG. 13B.

There are several methods that may be used to make block receptor sites. The choice of method depends in part on the material to be used as the organic layer on the glass. If the organic material is an amorphous or semicrystalline polymer, the receptor sites may be embossed into the polymer material with a mold that matches the block size and pitch for the device being produced (e.g. an active matrix LCD). In this case, it may be preferable to adjust the mold to take into account the differences in thermal coefficient of expansion between the polymer and the mold material.

Embossing is just one method of forming the receptor sites in a polymeric coating on the glass. The coating may alternatively be injection molded onto the glass substrate during the coating process. Alternatively, the receptor sites could be formed in the polymer by solvent casting a polymer solution onto a receptor site mold. The solvent cast sheet could then be laminated or transferred to the glass substrate.

It is also possible to form the receptor sites in a thin film of either thermoset plastic or crosslinkable organic material on the glass substrate. The receptor sites are formed by placing the liquid organic starting material on the mold. It is preferable to treat the mold with a release coating, such as an oil, a fluorinated coating, or a low-surface energy self-assembled monolayer coating, or one of these materials combined with a metal layer that separates readily from these coatings, such as silver. The glass substrate is then pressed on top of the liquid organic material, such that the liquid flows around all of the features of the mold, and any bubbles in the liquid are removed. The glass/organic/mold stack is then exposed to sufficient heat or UV light, if necessary, for a sufficient time to cure the liquid organic material into a crosslinked solid material. The mold is then separated from the organic film on the glass.

It is also possible to pattern the material without a mechanical mold by using light energy. There are two techniques to accomplish this. First, standard photolithography techniques could be used on a photopatternable material to expose and develop away the volume of material in the receptor site. In this case, the photopatternable material serves as the substrate material. Alternatively, a mask layer could be used on top of the organic material, such that the organic material could be etched with a plasma etch system. This method would apply to a larger class of organic substrate materials because the organic material does not need to be photopatternable. It is also possible to form the receptor sites in the organic layer by using a laser drilling or laser ablation technique as described above in conjunction with FIGS. 12A and 12B. This method is advantageous because it will work on a large class of organic materials, and does not require a photolithography step. This method can also be used on a plastic substrate on a metal foil. The process can either be tuned to etch down to a particular depth in the plastic or a plastic-on-foil laminate structure can be used to create an etch stop. Preferably, the plastic film thickness can be the same as the desired depth of the receptor site, such that in the laser ablation process the metal foil serves as an etch stop as described above.

While the foregoing description has provided examples of the present invention, it will be apparent that various modifications may be made within the spirit and scope of the invention which is limited only by the following claims. For example, the order of the processing operations may be modified and the same or similar result achieved in the resulting structure.

What is claimed is:

1. A method for creating an opening on a substrate, said opening for receiving an element which is fabricated on another substrate and is placed in said opening, said method comprising:

forming an organic layer on a substrate;

forming a beveled opening in said organic layer, said beveled opening having at least two slopes along each sidewall of said beveled opening, wherein one of said at least two slopes is an average of said at least two slopes and one of said at least two slopes is substantially vertical and wherein said beveled opening has a top edge that is beveled and that is said average of said at least two slopes, and the rest of said beveled opening is deep without having a large upper cross-sectional area; and receiving said element in said beveled opening by fluidic self assembly.

2. A method as in claim 1 wherein said beveled opening is formed by one of embossing said organic layer or molding said organic layer to have said beveled opening or photolithographically exposing and developing said organic layer.

3. A method as in claim 2 further comprising, after said beveled opening is formed, a method for assembling a structure onto said substrate wherein a plurality of openings, including said opening, are created in said organic layer, said method for assembling comprising:

dispensing a slurry over said organic layer, said slurry comprising a fluid and a first plurality of elements each of which is designed to mate with a corresponding one of said plurality of openings and each of which comprises a functional element.

4. A method as in claim 3 wherein said element is surface treated such that said element and said organic layer have similar surfaces which are one of hydrophobic and hydrophilic to enhance said fluidic self assembly.

5. A method as in claim 1 wherein said substrate is flexible.

6. A method as in claim 1 wherein said beveled opening is about 0.5 µm to about 5 µm larger that said element.

7. A method as in claim 6 wherein said beveled opening includes beveled edges and vertical edges on each sidewall.

8. A method as in claim 7 wherein said beveled opening have a staircase edge on said each sidewall.

9. A method as in claim 1 further comprising, after said beveled opening is formed, a method for assembling a structure, said method for assembling further comprising:

receiving said element in said beveled opening, wherein said structure comprises an antenna.

10. A method comprising:
forming an organic layer on a substrate;
forming an opening in said organic layer, said opening designed to receive an element of similar predetermined size; and
depositing said element in said opening by fluidic self assembly, wherein said element is surface treated such that said element and said organic layer have similar surfaces which are one of hydrophobic and hydrophilic to enhance said fluidic self assembly and
wherein said opening has a top beveled edge leading to a substantially vertical edge and deeper edge.

11. A method as in claim 10 wherein said opening is formed by one of embossing said organic layer or molding said organic layer to have said opening or photolithographically exposing and developing said organic layer.

12. A method as in claim 10 wherein said substrate is flexible.

13. A method as in claim 10 wherein forming said opening by embossing said organic layer further comprising:

providing a mold having a predetermined size to form said opening
embossing said mold into said organic layer, wherein said predetermined size of said mold matches said element size and pitch.

14. A method as in claim 13 wherein said opening is about 0.5 µm to about 5 µm larger that said element.

15. A method as in claim 10 wherein forming said opening by embossing said organic layer further comprising:

placing a mold having a predetermined size to form said opening on said substrate;
flowing a liquid organic material on said substrate and around said mold;
curing said liquid organic material to form said organic layer;
separating said mold from said substrate and said organic layer, wherein said mold has a predetermined size that matches said element size and pitch.

16. A method as in claim 15 wherein said opening is about 0.5 µm to about 5 µm larger that said element.

17. A method as in claim 10 wherein said opening includes beveled edges and staircase edges on each sidewall.

18. A method as in claim 10 wherein said beveled edges have at least two slopes along a surface of said opening and along each sidewall of said opening, wherein one of said slopes is an average of said at least two slopes and one of said slopes is substantially vertical.

19. A method as in claim 10 further comprising, after said opening is formed, a method for assembling a structure onto said substrate wherein a plurality of openings, including said opening, are created in said organic layer, said method for assembling comprising: dispensing a slurry over said organic layer, said slurry comprising a fluid and a first plurality of elements each of which is designed to mate with a corresponding one of said plurality of openings and each of which comprises a functional element.

20. A method as in claim 10 further comprising, after said opening is formed, a method for assembling a structure, said method for assembling comprising:

receiving said element in said opening, wherein said structure comprises an antenna.

21. A method comprising:
depositing an element in an opening by fluidic self assembly, said opening is formed in an organic layer that is formed on a substrate, wherein said opening having at least two slopes along each sidewall of said beveled opening, wherein one of said at least two slopes is an average of said at least two slopes and one of said at least two slopes is substantially vertical and wherein said opening has a top edge that is beveled and that is said average of said at least two slopes, and the rest of said opening is deep without having a large upper cross-sectional area.

22. A method as in claim 21 wherein said dispensing further comprises dispensing a slurry over said organic layer, said slurry comprising a fluid and a first plurality of elements each of which is designed to mate with a corresponding one of said plurality of openings and each of which comprises a functional element.

23. A method as in claim 22, further comprises adapting said method to fabricating an antenna device.

24. A method as in claim 22 wherein said element is surface treated such that said element and said organic layer have similar surfaces which are one of hydrophobic and hydrophilic to enhance said fluidic self assembly.

25. A method as in claim 21 wherein said substrate is flexible.

26. A method as in claim 21 wherein said opening is about 0.5 µm to about 5 µm larger that said element.

27. A method as in claim 21 wherein said opening includes beveled edges.

28. A method as in claim 27 wherein said beveled edges have at least two slopes along a surface of said opening, wherein one of said slopes is an average of said at least two slopes and one of said slopes is substantially vertical.

* * * * *